United States Patent
Schie et al.

(10) Patent No.: US 12,061,975 B2
(45) Date of Patent: Aug. 13, 2024

(54) CHARGE BASED SWITCHED MATRIX AND METHOD THEREFOR

(71) Applicant: AISTORM INC., Cupertino, CA (US)

(72) Inventors: David Schie, Cupertino, CA (US);
Peter Drabos, Cupertino, CA (US);
Andreas Sibrai, Cupertino, CA (US);
Erik Sibrai, Cupertino, CA (US)

(73) Assignee: AISTORM INC., Cupertino, CA (US)

( * ) Notice: Subject to any disclaimer, the term of this patent is extended or adjusted under 35 U.S.C. 154(b) by 1307 days.

(21) Appl. No.: 16/597,522

(22) Filed: Oct. 9, 2019

(65) Prior Publication Data
US 2020/0110987 A1 Apr. 9, 2020

Related U.S. Application Data

(60) Provisional application No. 62/743,130, filed on Oct. 9, 2018.

(51) Int. Cl.
G06N 3/065 (2023.01)
H02M 3/07 (2006.01)
H03K 5/04 (2006.01)

(52) U.S. Cl.
CPC .............. *G06N 3/065* (2023.01); *H02M 3/07* (2013.01); *H03K 5/04* (2013.01)

(58) Field of Classification Search
CPC .................................. G06N 3/065; H02M 3/07
USPC ......................................... 706/15, 25, 38, 39
See application file for complete search history.

(56) References Cited

U.S. PATENT DOCUMENTS

| | | | | |
|---|---|---|---|---|
| 5,039,870 A | * | 8/1991 | Engeler | G11C 27/024 326/35 |
| 5,131,072 A | * | 7/1992 | Yoshizawa | G06N 3/065 706/38 |
| 5,148,514 A | | 9/1992 | Arima et al. | |
| 5,261,035 A | * | 11/1993 | Adler | G06N 3/065 704/200 |
| 5,483,184 A | | 1/1996 | Kuo | |
| 6,147,519 A | | 11/2000 | Krymski | |
| 6,445,623 B1 | | 3/2002 | Zhang et al. | |
| 7,053,684 B1 | | 5/2006 | Sen et al. | |
| 10,700,695 B1 | * | 6/2020 | Far | H03M 1/1205 |
| 2009/0072800 A1 | | 3/2009 | Ramadass et al. | |
| 2010/0277152 A1 | | 4/2010 | Macfarlane | |
| 2014/0344200 A1 | | 11/2014 | Schie | |
| 2017/0047841 A1 | | 2/2017 | Zojer et al. | |
| 2019/0080231 A1 | * | 3/2019 | Nestler | G11C 7/1006 |
| 2019/0341110 A1 | * | 11/2019 | Tran | H01L 29/7883 |

\* cited by examiner

*Primary Examiner* — William Hernandez
(74) *Attorney, Agent, or Firm* — Weiss & Moy PC; Jeffrey D. Moy

(57) ABSTRACT

A reconfigurable, for example with time, network switch matrix coupling switch charge circuits representing multiply and add circuits (MACs) and neurons (MACs with activations) capable of accepting and outputting proportional to charge pulses through crossbars within said network, said crossbars controlled by local controllers and higher level controllers to setup said crossbar communications.

14 Claims, 16 Drawing Sheets

CHARGE BASED SWITCHED MATRIX AND METHOD THEREFOR

RELATED APPLICATIONS

This patent application is related to U.S. Provisional Application No. 62/743,130 filed Oct. 10, 2019, entitled "A CHARGE BASED SWITCH MATRIX" in the name of David Schie, and which is incorporated herein by reference in its entirety. The present patent application claims the benefit under 35 U.S.C § 119(e).

TECHNICAL FIELD

The present invention generally relates to analog machine learning and, more particularly to, an analog neural network which uses a switch matrix comprised of neurons, wherein the switch matrix allows for i) rapid reconnection of communications paths; ii) communications which are not limited by finite loop bandwidths; iii) a connection means which is not limited by physical connections; iv) a connection means which is independent of device values, environment, temperature and other matching effects, and v) which does not require significant tuning, tweaking or global parameter matching or special devices.

BACKGROUND

Analog machine learning holds the promise of significant power savings, performance improvement, accuracy improvement and noise reduction compared to digital implementations. Generally, machine learning requires the implementation of a weighted summer, which may have a linear shift called a bias, as well as an activation or decision means to produce an output. Each output may be connected to many other weighted summers and these connections may need to be dynamically programmable, for example in recurrent networks, or virtual neuron schemes, as do the weights and bias values in all networks.

The means of analog implementation include several possible methods: i) the modulation of transistor operating point, such as triode mode resistance, as a weight against an input such as a voltage and the summing of multiple such paths to produce a weighted sum; ii) the use of a translinear loop such as an analog multiplier (e.g. Gilbert type multiplier) to produce a multiplied result; iii) the use of special devices such as a memristor to produce weighted inputs against a voltage or current input; iv) the multiplying of currents using a weighted current DAC; v) the use of a switched capacitor circuit where the switched capacitors are varied in size using input capacitor unit cells and switches.

Each of the above analog implementation means has significant disadvantages. For example (with indexes referencing the methods above), i) it is very difficult to produce programmable switch matrix connectivity because the fixed impedance of multiplexers and crossbars adds a device impedance unrelated to the modulation, its own environment (e.g. temperature) and processing dependencies interferes with the device modulation results and causes distortion requiring tuning measures. Additionally, the summing of currents has a bandwidth limitation and the triode mode is high power even if used only for short periods; ii) a translinear loop requires significant setup time and cannot be dynamically gated wasting power. It is also bandwidth limited; iii) it is difficult to reliably manufacture and use such special devices and they generally require significant tuning and tweaking through use of lookup tables, etc. which nevertheless results in distortion and speed limitations; iv) a weighted DAC requires digital bit storage which is power inefficient during learning and operation and also has distortion issues and bandwidth limitations; v) a switched capacitor circuit requires unit capacitors which use a lot of silicon area and further are very difficult to match, limiting resolution and enhancing distortion.

A neural network which can communicate information at very high data rates, and further which allows fast dynamic reconnection of the switch matrix or communications network may also be used to virtually increase the effective number of neurons by re-connecting neurons very quickly and re-using them based upon a time framed approach. This may increase the number of effective neurons by the number of frames that is used. It may alternatively or may also allow recurrent network functionality. For example, if there were sixteen time frames or time slots, then in the first frame one might have one network connectivity, in the second time frame another network connectivity and so forth. The result would look to the user like a network which is sixteen times the size.

Therefore, it would be desirable to provide a system and method that overcome the above problems. The system and method would produce a switch matrix comprised of neurons (weighted adders and activation functions) which allows: i) rapid reconnection of communications paths; ii) communications which are not limited by finite loop bandwidths; iii) a connection means which is not limited by physical connections; iv) a connection means which is independent of device values, environment, temperature and other matching effects, and v) which does not require significant tuning, tweaking or global parameter matching or special devices.

SUMMARY

In accordance with one embodiment, a switched charge circuit is disclosed. The switched charge circuit has at least one input charge storage device coupled to an input to receive a charge during an initial phase, wherein the at least one input charge storage device is initially reset to one of a potential or charge threshold. At least one output charge storage device is coupled to an output and to the at least one input charge storage device, wherein the at least one output charge storage device is initially reset to a charge level. A comparison device is coupled to a shared node connecting the at least one input charge storage device and the at least one output charge storage device. At least one first current source is coupled to the at least one output charge storage device. At least one second current source is coupled to the shared node connecting the at least one input charge storage device and the at least one output charge storage device proportional in magnitude to the at least one first current source to produce a one of a charge multiplication or division on the at least one output charge storage device. The at least one first current source and the at least one second current source are turned on at the beginning of a second phase and turned off when the shared node reaches one of a potential or charge threshold producing an output pulse proportional to a magnitude of the one of charge multiplication or division.

In accordance with one embodiment, a device to produce an input(s) weighted summer output is disclosed. The device has an input charge storage device and an output charge storage device. At least one input charge is coupled to the input charge storage device. A charge transfer device couples the input charge storage device and the output charge storage device. An output charge proportional to an input charge multiplied by a ratio of charge supplied by the charge transfer device is produced by the device.

In accordance with one embodiment, a ReLU decision circuit is disclosed. The ReLU decision circuit outputs a minimum pulse width corresponding to a threshold charge, and suppresses further pulse extension until at least a threshold charge level is reached on a switched charge circuit.

In accordance with one embodiment, a correlated double sampling reset mechanism is disclosed. The correlated double sampling reset mechanism has a charge storage device coupled to an input. A comparator is coupled to the charge storage device. A charge movement device coupled to the charge storage device, whereby the charge storage device is adjusted by the charge movement device until a switch point of the comparator is reached in one phase and after which during a second phase an input charge is loaded onto the charge storage device adjusting a charge level on the charge storage device, after which the charge movement device is enabled until the comparator switch point is reached again, wherein certain noise and offsets are loaded into the charge storage device during an initial reset phase, and again during the second phase thereby cancelling certain of the noise and offset.

In accordance with one embodiment, a charge proportional pulse-based neuron is disclosed. The charge proportional pulse-based neuron has a first charge storage device coupled to at least one gated input charge movement device, wherein the at least one gated input charge movement device is programmable in magnitude against a gated master charge movement device, wherein the at least one gated input charge movement device is gated by input pulses proportional in time to a charge value. A first comparator device is coupled to the first charge storage device, wherein the first charge storage device is initially charged to a switch point of the first comparator device. A second charge storage device is provided. A second comparator device is provided, wherein the second charge storage device is initially charged to a switch point of the second comparator and then a charge proportional to a threshold removed from the second charge storage device. A second charge movement device proportional in magnitude to the master charge movement device is gated by the second comparator device. The master charge movement device and the second charge movement device are enabled after input charges are loaded, the master charge movement device staying on until the switch point of the first comparator is reached and the second charge movement device staying on until the switch point of the second comparator device is reached, wherein a time it takes for the latter of the switch point of the first comparator device or the switch point of the second comparator device to be reached is buffered to a driver to produce a ReLU decision pulse proportional to charge output.

In accordance with one embodiment, a calibration circuit is disclosed. In the calibration circuit a maximum charge pulse width is provided to a neuron and local charge movement device magnitudes are adjusted against the maximum pulse width so as to replicate the maximum pulse width for an input weight of I (e.g. the charge loading weight current source is equal to the master or replenishing current source). In accordance with one embodiment, a crossbar is disclosed. The crossbar is driven by a dynamic driver capable of coupling charge proportional pulses. The crossbar is coupled to a local controller capable of making dynamic crossbar connections responsive to a frame time.

In accordance with one embodiment, a short-term memory/sample and hold circuit is disclosed. The short-term memory/sample and hold circuit has a pair of switches in series sharing a common node, wherein the first switch is coupled to an input voltage to be sampled and the second switch is coupled to a charge storage device output for storing the input voltage sampled. A biasing device is coupled to the common node to program a potential of the common node. By minimizing the voltage across the junctions within the switch through this biasing, the short-term memory/sample and hold circuit maximizes a hold time of the charge storage device output by minimizing channel leakage and other junction leakages.

In accordance with one embodiment, a driver circuit for a sampling switch is disclosed. The driver circuit for a sampling switch comprising a cmos inverter coupled to a level shifting element, wherein the cmos inverter is coupled to the sampling switch such that a voltage range of the cmos inverter is limited in proportion to a voltage required by the sampling switch.

In accordance with one embodiment, an input layer is disclosed. The input layer, wherein an input is first multiplied by one of a fixed, programmable or learned quantity so as to normalize it before applying it subsequent layers.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

Analog machine learning holds the promise of significant power savings, performance improvement, accuracy improvement and noise reduction compared to digital implementations. However, current analog implementation means has significant disadvantages as outlined above.

One solution to such an analog neural network is built upon the concept of a switched charge. Switched charge circuits are very different to switched capacitor circuits which couple voltage or current because switched charge circuits are not dependent upon capacitor matching or in some implementations finite bandwidth devices such as operational amplifiers. The only requirement on the capacitors is that the capacitors are large enough to store any charge coupled to them. Matched capacitor values, linearity, flatness and other factors which produce errors in the voltage or current switched capacitor domain are not relevant in the switched charge circuit domain.

Figure 1A:
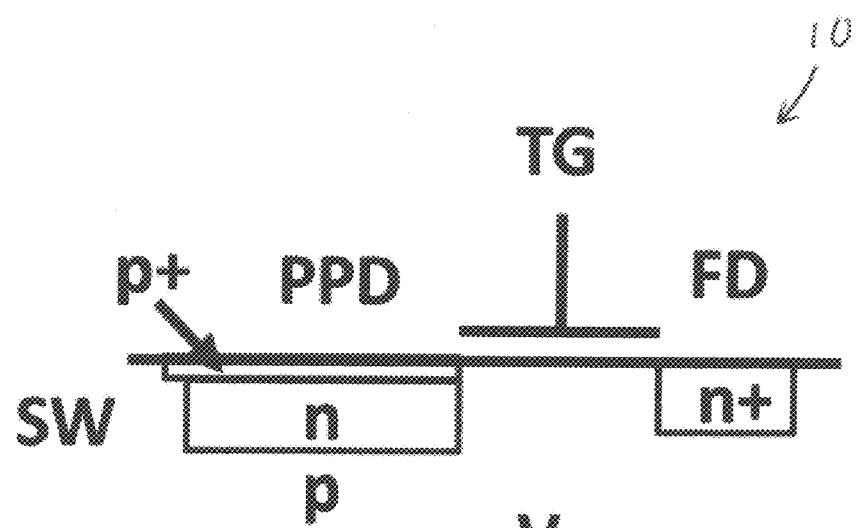
FIG. 1A shows a spill and fill circuit.

Switch charge circuits may be implemented using capacitors as charge storage devices and current sources for addition or removal of charge. Charge storage can also be implemented with other charge storage devices such as pinned photodiodes, floating diffusions, mems membranes or charge coupled devices as might be used by those skilled in the art of sensors. Similarly, charge addition or removal might be implemented through the use of spill and fill circuits such as that shown in FIG. 1A. Additional means of charge addition or removal are known to those skilled in the art. Due to the various switch charge implementations we will refer to switch charge circuits as zcells from time to time.

Figure 1B:
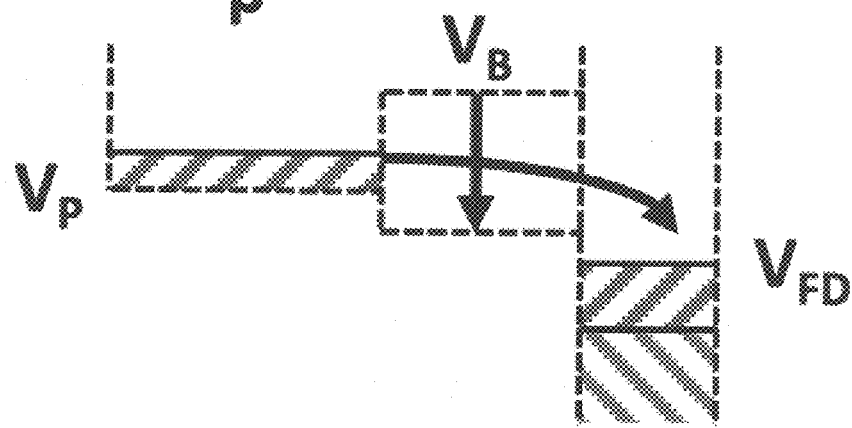
FIG. 1B shows an energy diagram from a storage well SW charge reservoir into a floating diffusion FD charge reservoir for the spill and fill circuit of FIG. 1A.

The spill and fill circuit 10 uses the concept of a pinned photodiode (PPD) charge receptacle holding electrons in front of a transfer gate TG. The transfer gate TG is lowered and raised in conformance with required electron flow. At some point the transfer gate TG lowers the potential barrier and the electrons spill from the storage well SW charge reservoir into the floating diffusion FD charge reservoir. The devices are created so as to ensure that all electrons move from the storage well SW charge reservoir into the floating diffusion FD charge reservoir. FIG. 1B shows the energy diagram from the storage well SW charge reservoir to the floating diffusion FD charge reservoir.

Figure 2:
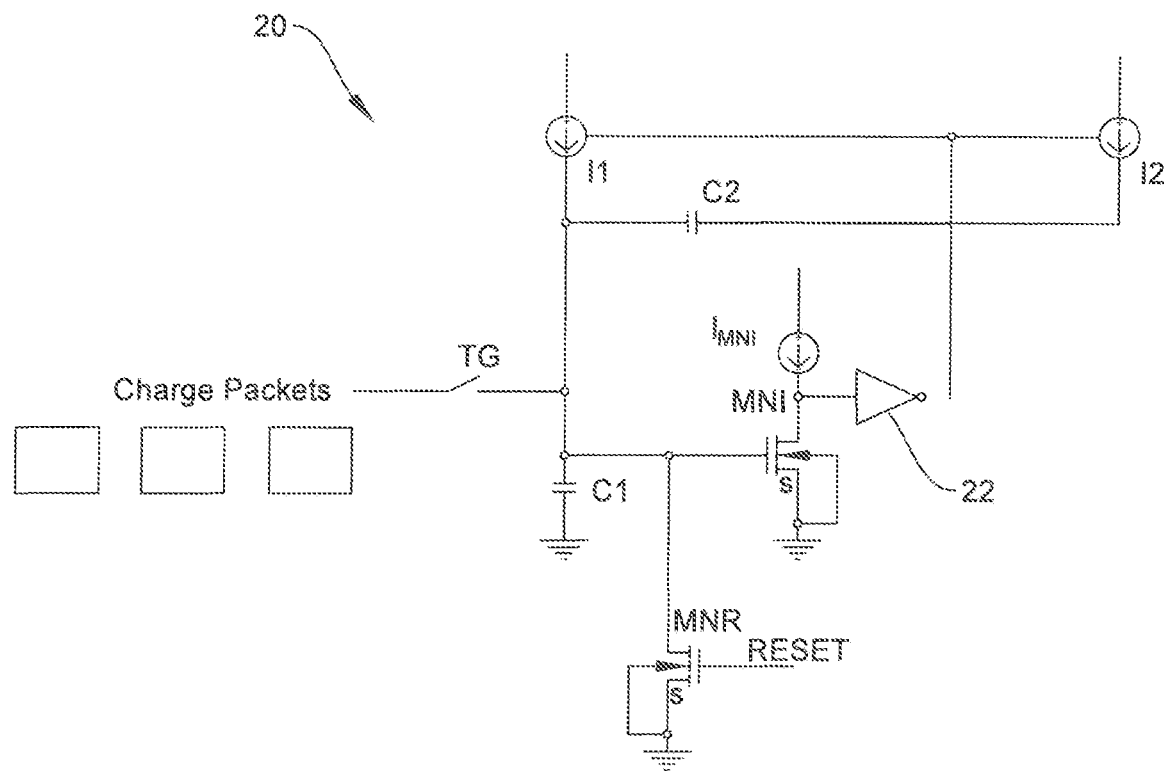
FIG. 2 shows a block diagram of a "Single Transistor" charge multiplier circuit.

An efficient analog multiplier may be implemented as a charge multiplier, similar to that shown in FIG. 2. The charge multiplier 20 (hereinafter multiplier 20) shown in FIG. 2 is the same as that shown in U.S. Patent application entitled "Single Transistor Multiplier and Method Therefor", having Ser. No. 16/291,311, in the name of the present inventor, and which is incorporated herewith.

The multiplier 20 may have a reduced number of transistors. In accordance with one embodiment, the multiplier 20 may have a MOSFET MN1. The MOSFET MN1 may be arranged in a common source configuration. A current source $I_{MN1}$ may be coupled to the drain of the MOSFET MN1. An inverter 22 may be coupled to the drain terminal of the MOSFET MN1. An output of the inverter 22 may be used for gating two current sources I1 and I2 whose current magnitudes may be proportional.

A capacitor C1 may have a terminal coupled to the first current source I1 and to the gate of the MOSFET MN1. A second terminal of the capacitor C1 may be grounded. The first current source I1 may be coupled to a second terminal of a capacitor C2 and to the gate of the MOSFET MN1. The second current source I2 may be coupled to the first terminal of the second capacitor C2.

A reset switch may be coupled to the gate of the MOSFET MN1. In accordance with one embodiment, the reset switch may be a reset transistor MOSFET MNR. In the present embodiment, the MOSFET MNR may be configured in a common source configuration. A gate terminal of the MOSFET MNR may be coupled to a reset signal RESET. A transfer gate TG may be coupled to the gate terminal of the MOSFET MN1, the first terminal of the capacitor C1, the second terminal of C2 and the current source I1.

The basic idea is to couple a means of charge movement to the first charge storage reservoir, in this case the capacitor C1 and other capacitances coupled to the gate input node, and a second means of charge movement to the second charge reservoir, in this case the floating capacitor C2, where the movement rates of the charge movement means are proportional and both gated by the same comparator, i.e., the MOSFET MN1 in a common source configuration used as a comparator correlated to its Vt comparator threshold.

The multiplier 20 may operate in the following manner. Initially, the transfer gate TG is open and the current source MOSFETs which create I1 and I2 discharge the capacitor C2 by pulling it to the rail or alternatively an additional switch is coupled to the first terminal of the capacitor C2 and the MOSFET MNR is held low. These methods will ensure capacitor C2 is discharged. Once the capacitor C2 is discharged other transistors (including current sources) are turned off. Alternatively, the first terminal of C2 could be grounded and then the reset transistor MOSFET MNR pulls the gate below the trip threshold Vt and the current source I1 is enabled to start charging the MN1 gate node. At some point the voltage on the gate of the MOSFET MN1 causes the drain of the MOSFET MN1 to invert and the output of the inverter 22 turns off the current source I1. The gate terminal of the MOSFET MN1 is now a voltage which corresponds to a comparator threshold Vt. C2 will also hold Vt or will have no voltage across it depending upon the chosen reset method. Alternatively, C2 may be reset twice and I1+I2 used to establish the Vt threshold to maintain constant charging currents and reduce slope (common source comparator overshoot) related errors.

As may be seen in FIG. 2, charge packets may be introduced to the left side of the transfer gate TG. In accordance with one embodiment, the charge packets are negative charge packets. The current sources I1 and I2 may be programmed proportional to each other to form the desired multiplicand. When the transfer gate TG is turned on electrons will couple to the MN1 gate node reducing its voltage potential.

The charge packet could be a current source discharging the MN1 gate capacitance. The charge packet could also be a charge removed in conformance with charge stored in the charge reservoir of a pinned photodiode from an active pixel or the floating diffusion from an active pixel or the output of a CCD shift register. It could also be a capacitor in parallel with this node formed for example by a MEMs membranes forming a proportional to sound capacitor in a microphone.

In some cases, such as a gated current source discharging (providing the charge input information) the MN1 gate capacitance, a transfer gate is not required.

After transfer gate TG is turned on and the voltage on the gate of the MOSFET MN1 falls in proportion to the input charge below the Vt comparator threshold, the current sources I1 and I2 are turned on. The capacitor C1 is charged by I1+I2 until the Vt comparator threshold is reached at which time the inverter 22 turns off the current sources I1 and I2. The time it takes to charge the capacitor C1 to the Vt comparator threshold may be represented by the equation tcharge=Qin/(I1+I2). During this time the capacitor C2 is charged by the current source I2 only. This occurs for a time Qin/(I1+I2) putting a charge of Qin*I2/(I1+I2) into the capacitor C2. Thus, the input charge has been multiplied by I2/(I1+I2) and stored on the capacitor C2.

As the charge on the floating capacitor C2, is adjusted only by the second charge movement means it will move by a charge $\Delta Q_{out}=I2*\Delta t$, while the first will move by a charge $\Delta Q_{in}=(I1+I2)*\Delta t$, therefore the $\Delta Q_{out}=I2/(I1+I2)*\Delta Q_{in}$ which is a function only of the ratio of charge movement.

Note that the act of first initializing both capacitors C1 and C2 to the MN1 comparator trip point, and then removing charge performs a correlated double sampling (CDS) function removing offset and certain noise. To optimize this, the slope of the rise of the common source comparator MN1 gate should be constant. This can be achieved by maintaining I1+I2=constant while adjusting the ratio of I1 to I2. It can also be improved by adding positive feedback akin to a Schmitt trigger type action around the common source comparator. The initial reset may be performed with the same constant current. The charge movement means could be current sources or spill and fill type circuits, or could be other types of charge movement means known to those skilled in the art. The charge storage means could be capacitors, pinned photodiodes, floating diffusions, charge coupled devices, mems membranes such as those used in a mems microphones or other charge storage means known to those skilled in the art. If the floating capacitor is first charged by grounding the right side terminal to precharge it to Vt, the voltage across the floating capacitor will be decreasing during the second phase and the multiplied charge result is the switch point of the common source comparator MN1 less the voltage associated with the multiplied or divided input charge change divided by the floating capacitor capacitance—making it compatible for further operations with the same common source comparator switch point. If the reset method removed all charges then the voltage across C2 will be the multiplied input charge change divided by the floating capacitance only. Note that multiplication or division are set by current magnitudes and inherently the same thing.

Figure 3:
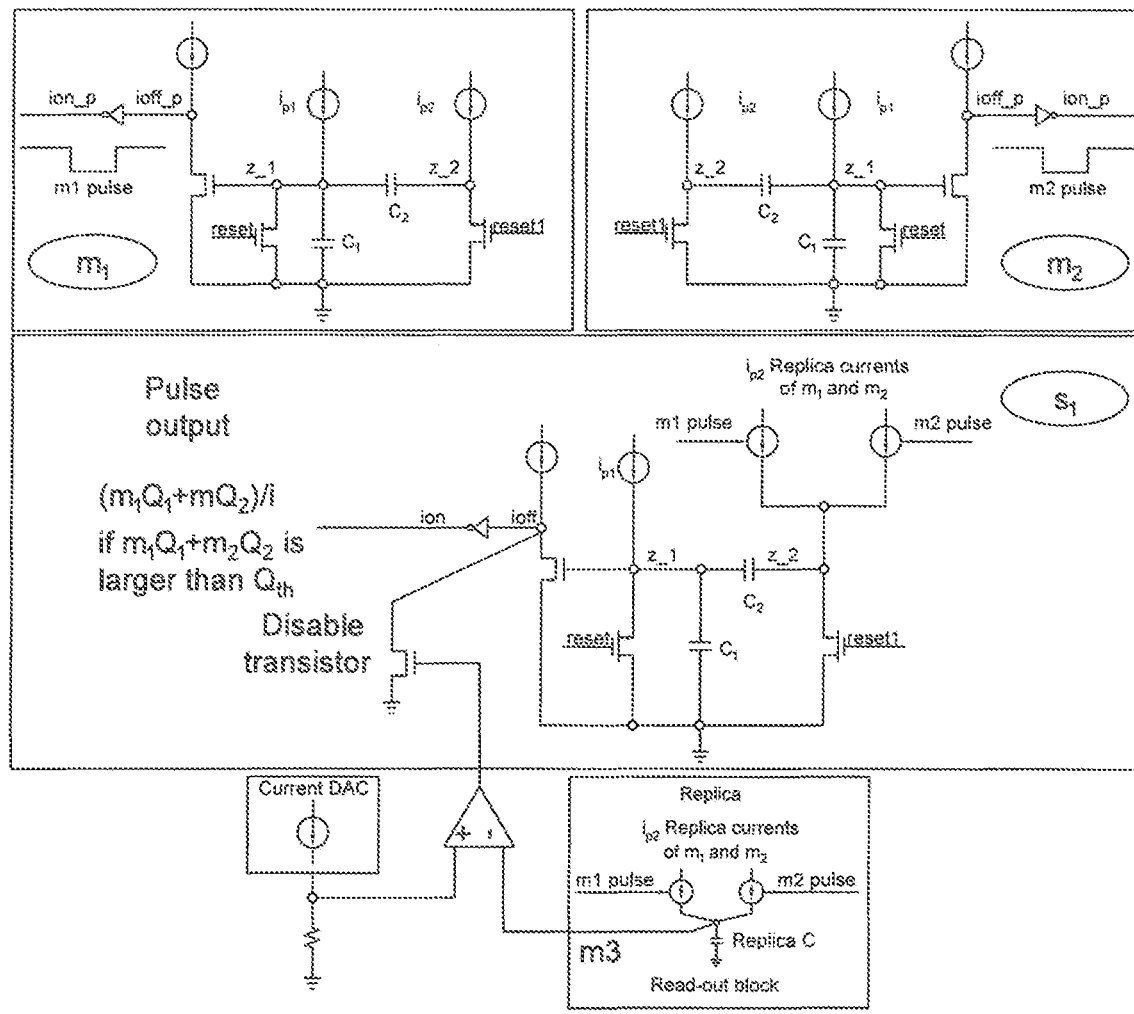
FIG. 3 is a block diagram showing an exemplary embodiment of a neuron (MAC+activation) in accordance with one aspect of the present application.
Figure 4:
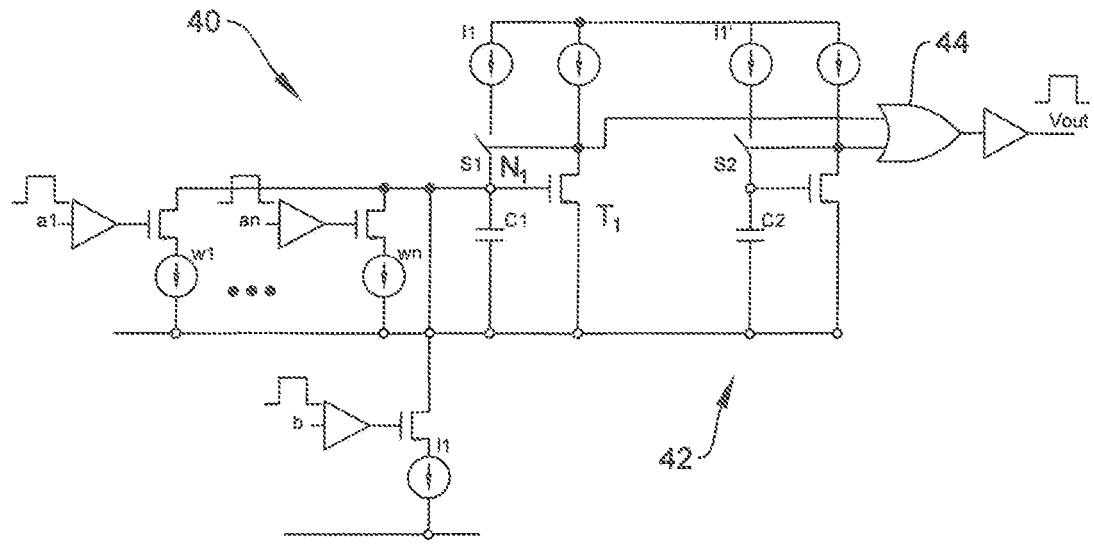
FIG. 4 is a block diagram showing an exemplary embodiment of a neuron compatible with a simple proportional to charge pulse switch matrix if a floating capacitor is not required, in accordance with one aspect of the present application.

Instead of coupling the first and second charge storage means (i.e., capacitors C1 and C2 respectively) directly to subsequent circuits, the multiplied charge outputs could be coupled in some other way such as pulses proportional in width to charge. FIGS. 3 and 4 illustrate such methods.

In FIG. 3, the building blocks of one implementation of a neuron may be seen. At the top of FIG. 3, $m_1$ and $m_2$ represent multipliers accepting charge as their input. Although only two multipliers may be shown, any number of multipliers could be present. Further to the explanation of the multiplier 20 of FIG. 2, $m_1$ and $m_2$ generate pulses proportional to multiplied charge by outputting a pulse during the time that the charge movement means (current sources in this case) are restoring the common source comparator to its original switch point after the input charges are loaded.

These pulses may be coupled dynamically to any number of additional charge input devices. For example, in FIG. 19, ReLU activation functionality is be shown. This function can be implemented by taking the pulses generated by $m_1$ and $m_2$ shown in the "Replica" block at the bottom of FIG. 3, which is further coupled to a comparator with a programmable reference. Additionally, $m_1$ and $m_2$ are also coupled to yet another single transistor multiplier. The "Replica" functionality can ensure that the output pulse does not terminate until a minimum "rectified" time has elapsed by effectively OR'ing this minimum "rectified" charge with the charge multiplied charge pulses from m1 and m2. If the charge on C2 is not needed then C2 can be omitted as shown in FIG. 4.

The resulting pulse, $m_3$, will contain charge information such that in subsequent stages, the charge movement means do not need to be matched to previous stages current movement means. To turn $m_3$ into a ReLU decision pulse one simply needs to ensure the output pulse is not less than the equivalent threshold charge pulse width. In this case, the threshold charge is shown as a current DAC which might be used to set the threshold charge, however, any means by which to generate a threshold charge against which the integrated charge from the gated input pulses may be compared would work provided that the charge movement means for the decision integrator are proportional to those of the single transistor charge multiplier used for the decision circuit output stage. Notice that the result could be normalized by adjusting the charge current during the output phase against the gated input currents in both the single transistor charge multiplier stage of the decision circuit as well as the integrated blanking stage implemented by the Disable transistor and DAC. Note that the threshold charge could be a half charge, or other charge that optimizes learning. The threshold or half charge could also be set as part of the learning process. The threshold charge might also be implemented as pre-loaded bias which would represent a minimum charge to overcome before the charge could be terminated (if m1+m2 had zero input charge). By outputting a pulse during the time that the charge movement means are turned on, we can communicate charge information as an activation output to subsequent stages.

By adding additional comparator threshold(s), it may be possible, based upon a piece wise linear implementation for example, to approximate other decision functions such as SeLU, sofiplus, sigmoid, leakly ReLU, swish, etc. by changing the current on the summation circuit based upon the comparator outputs. In the case of a leaky ReLU, the slope of the leaking portion could also be part of the learning process.

In FIG. 4, an alternative neuron 40 which can accept and output information as charge proportional pulses, and therefore is compatible with a simple switch matrix implementation is shown. This implementation requires no floating capacitor circuit (but they may be used if they are desired for other purposes). In this case the weights are set by the ratio of the magnitude of input current sources gated by the switches a1 . . . an and b to the magnitude of I1. By turning on these current source inputs each proportional to the output current according to a weight value set by a proportional current magnitude for a period of time proportional to input data, one can perform charge multiplication and summation for multiple simultaneous, even overlapping, inputs. In fact, each neuron may have its own maximum, minimum or threshold (e.g. mid-range) charge level—there is no need for a global correlation since each gated pulse will be relative to a maximum pulse, creating a charge proportional to the local maximum charge. Ie. the output pulse for a weight of 1 may be matched to a global (maximum) master pulse by adjusting the magnitudes of current sources I1, w1 . . . wn.

By setting the maximum charge range, one may also implement a soft maximum. This can also be implemented by limiting the minimum gate voltage, for example with a follower or other DC circuit, holding the minimum gate voltage to a potential or by diode clamping to the ground node or level shifter potential.

In the above discussion it is important to note that the charge movement means may be suppressed by a switch such as S1 in FIG. 4 or a transistor (not shown) from the drain of the MN1 comparator drain to ground in FIG. 2 until all of the inputs have been loaded. This is done by ensuring a minimum time passes before turning off this disable transistor or through a controller means which flags when all inputs are loaded. This means allows us to be agnostic as to when the input charges arrive as long as they do so during an input time window. The output circuitry could also request the pulse when it is desired, as could a controller, to end the charge collection (sum) input phase and begin the I1 recharge phase which initiates the output pulse.

In FIG. 4, all inputs and bias (if used) need to be collected and to reach a level before the switch S1 enables I1 to charge the common source comparator gate node N1. This ensures that an event driven operation, such as a neuron which does not change sufficiently, will not be included in an update if too little charge is collected. Sometimes this is not desirable as it eliminates part of the charge range and this minimum level is not used. Where a full range over values to zero are desired it may be necessary to load in a minimum charge corresponding to a zero pulse. For example a 1ns pulse could represent 0 and 8 ns represent 256. Although these two levels are established the resolution between 1ns and 8 ns may still be 8 bits or more. This minimum charge may be implemented as a stored bias value set against a global master (minimum) pulse. In other cases, it is desirable not to have neurons with too little change participate to save power—such as neuromorphic implementations. The methods taught in FIG. 4 allow either type of functionality. When the common source comparator gate node N1 is reset to the switch point and thereafter, once all inputs have been loaded, the switch S1 is enabled to produce the pulse. The use of the switch S1 allows the circuit 40 to decide when the pulse is generated. This allows asynchronous inputs to be collected. In the present example, the weights are set as current magnitudes labelled as w1 through wn (fractionally proportional to I1), and a full I1 with gated input is shown as an example bias input. The number of inputs is only limited by the additional drain capacitances, certain noise cancellation or minimization and the desired response time of the circuit 40. The bias input I1, as well as the weights w1 through wn, are set by the current ratios as before. The result is an extremely robust multiply and sum circuit that operates only with pulse input and produces pulse output information, enabling a simplified switch matrix.

Figure 18:
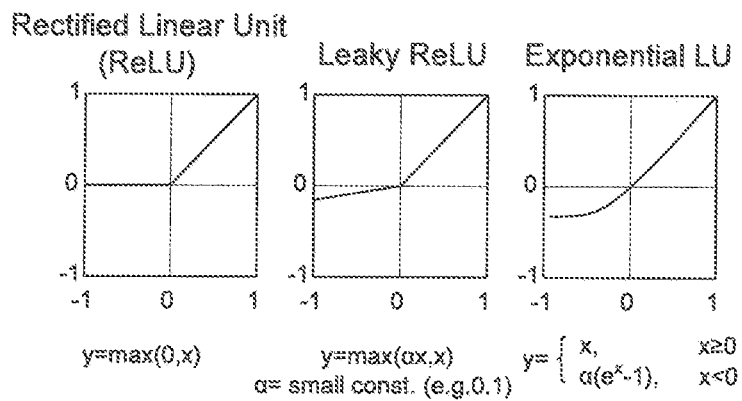
FIG. 18 are graphs of an exemplary embodiment of a rectified linear type decision circuits in accordance with one aspect of the present application.
Figure 19:
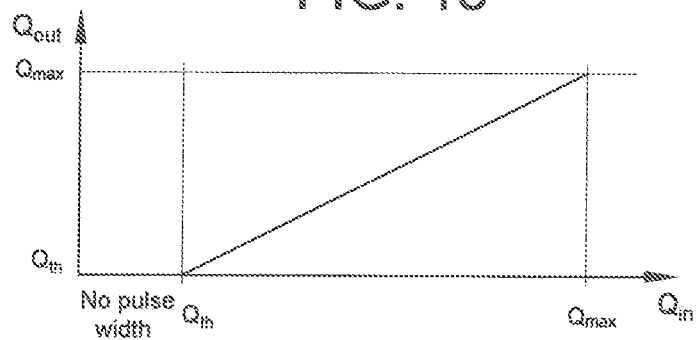
FIG. 19 is a graph showing an exemplary embodiment of a RELU function in accordance with one aspect of the present application.

Also illustrated in FIG. 4 is a novel decision or activation circuit 42. If the capacitor C2 had been previously reset, and a half charge or other threshold removed from it thereafter (charge causing voltage potential to be reduced below the trip point), then if a second current source I1' equal in magnitude to I1 were enabled at the start of the I1 charge output (start of recovery to the reset level) and OR'ed for example by gate 44 then the output pulse at node Vout would be a rectified linear (ReLU) decision circuit. Other types of decision circuits may be created by using two quadrant operation in cooperation with 42 as illustrated in FIGS. 18 and 19.

Figure 20:
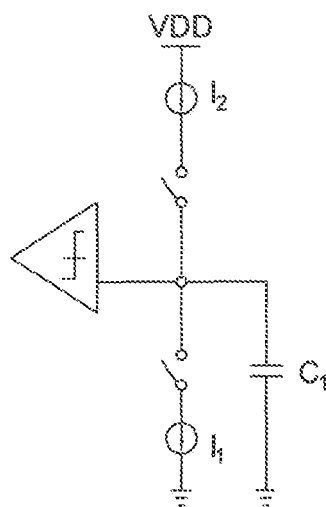
FIG. 20 is a block diagram showing an exemplary embodiment of a circuit for two-sided charge addition or removal in accordance with one aspect of the present application.

The method of using a common source comparator could also be implemented in two quadrants where charge is either added or subtracted from the comparator trip point as shown in FIG. 20. In this method the comparator gate node is first reset to the correct initial threshold for the quadrant of operation (voltage rising or voltage falling to produce a switching action). To overcome the "deadzone" of this class B implementation, those skilled in the art are aware that many strategies exist to overcome the "deadzone" using class AB techniques and therefore two quadrant operation is possible without said "deadzone." In this case a single "reset level" may be used for both quadrants.

The charge movement means may be implemented through use of a charge trap device. One embodiment of a charge trap device 170 may be seen in FIG. 17. The control nodes of charge trap devices may be continuously adjusted using charge pulses allowing adjustment of charge multiples on a single equivalent bit which saves power compared to multiple bit digital schemes. It has been shown that small adjustments to the charge trap devices do not have the same degradation effects on non-volatile memory that full digital write or erase do. This opens the possibility of using the charge trap device for neural network learning without a short-term dynamic memory. Alternatively, a short-term memory 70 such as that shown in FIG. 16 could be used. This memory 70 could copy values from non-volatile memory (NVM) and then be used for adjustments and written back to NVM as required. CIS techniques (cmos image sensor) such as depleted junction transfer gates and floating diffusions could alternatively be used for this short-term memory as could charge couple device memory.

Figure 11:
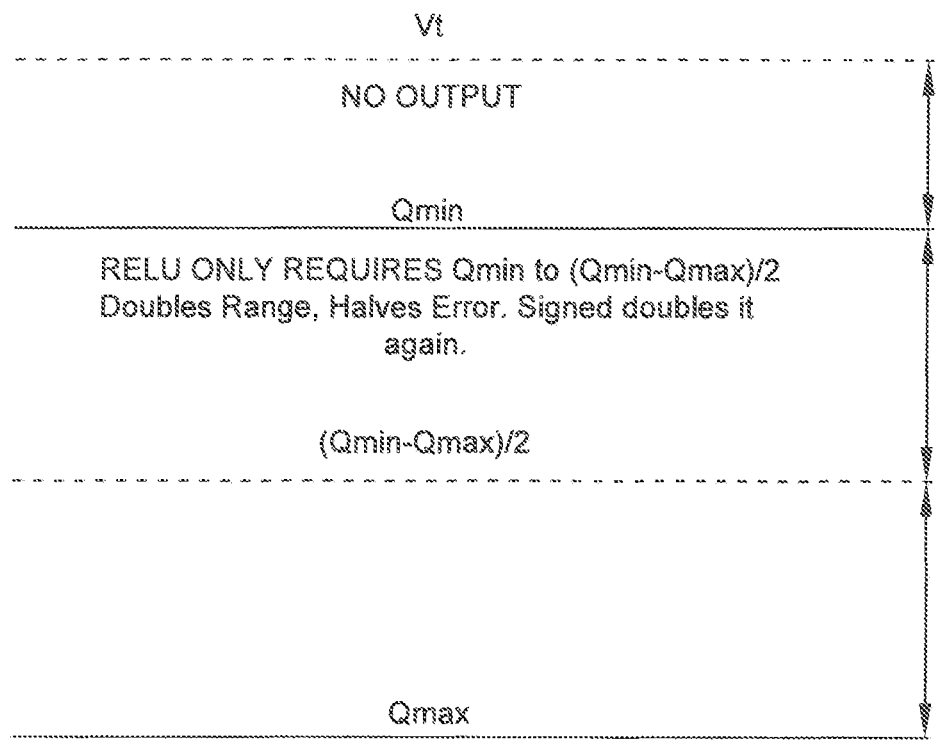
FIG. 11 is a diagram showing an exemplary embodiment of a charge range in accordance with one aspect of the present application.
Figure 12:
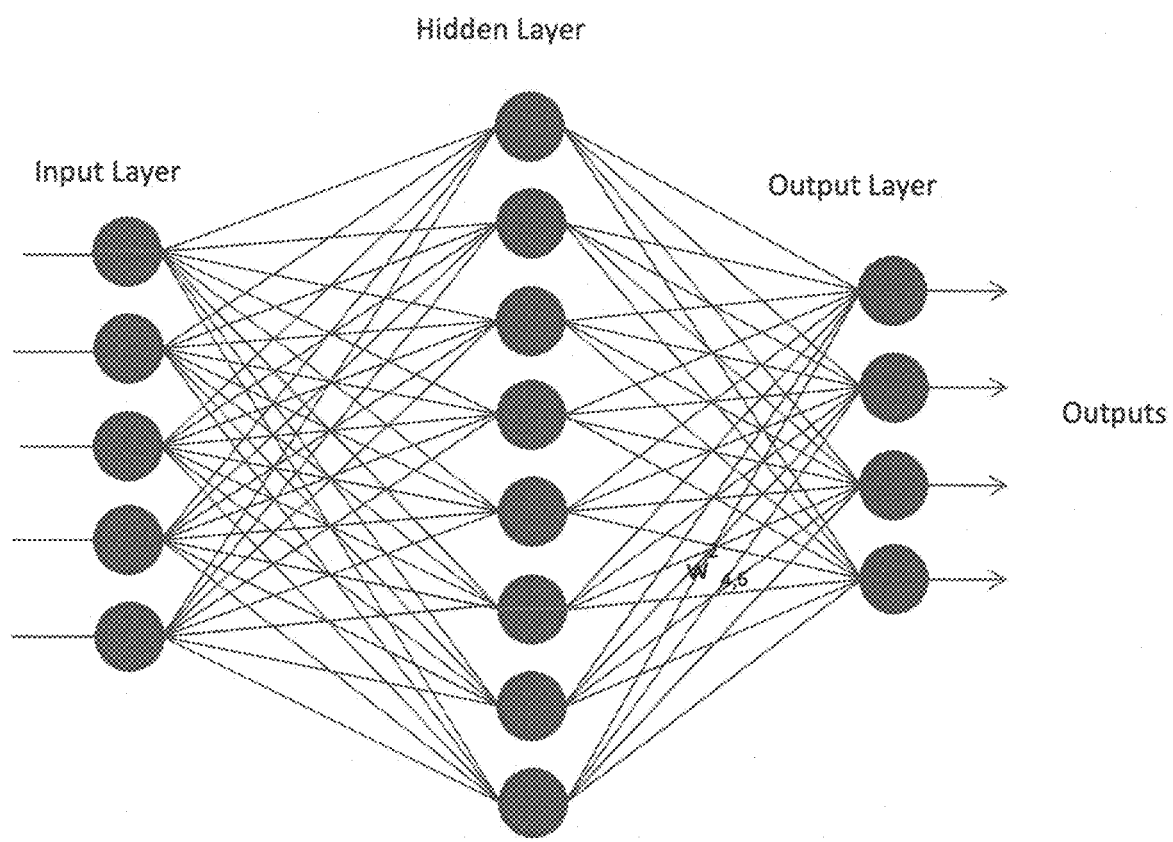
FIG. 12 is a block diagram showing an exemplary embodiment of a use of Zcell to allow factory programming paths in accordance with one aspect of the present application.

It should be noted that the absolute charge range for each neuron does not need to match. In one implementation, the only calibration required on the local level is to provide a maximum pulse to establish the charge range, and optionally a minimum pulse to establish the minimum or zero of the charge range (which thereafter could be added each cycle as a fixed minimum charge). This may be necessary to ensure we overcome the "deadzone" of uncertainly near the common source comparator switch point. Positive feedback along the lines of an improved Schmitt type architecture could also help reduce the "deadzone" as could class AB biasing techniques. Subthreshold operation would also increase the gain of the common source MOSFET and thereby improve switching along or in conjunction with these other techniques. In an imaging system this could be accomplished by exposing the input stage to a maximum global shutter exposure and propagating through the network a full charge, or similarly a minimum exposure. This concept is illustrated in FIG. 11. At each MAC (e.g. FIG. 4 without 42) or neuron (including 42), a maximum width is received and the maximum charge could be recorded by adjusting local charge movement means to a reasonable dynamic range. If a ReLU or derivative type circuit is used then only a threshold level or other threshold charge needs to be communicated as would be the maximum pulse output. Optionally, a threshold charge may be established which would produce an event driven neuron switch matrix, saving power. Specifically, unless the inputs produced a charge greater than then the neuron would not produce a pulse output at all.

Figure 13:
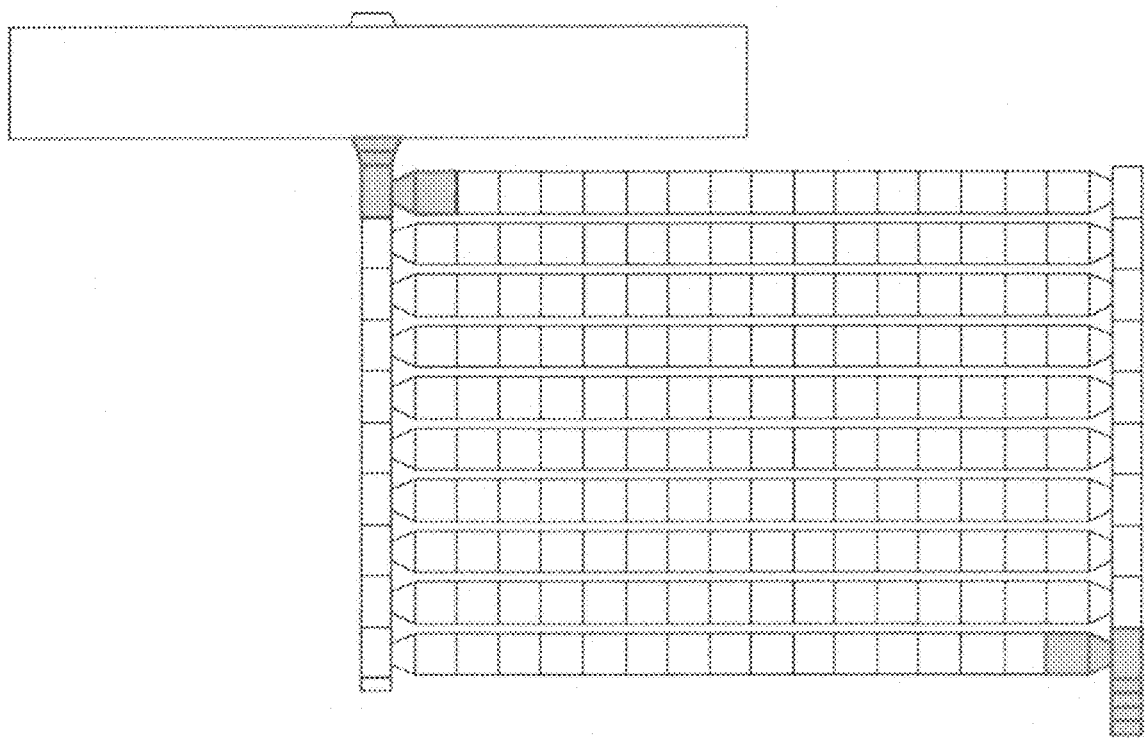
FIG. 13 is block diagram showing an exemplary embodiment of a photodiode coupled to a 2D CCD shift register which might be used for systolic manipulation in accordance with one aspect of the present application.
Figure 14:
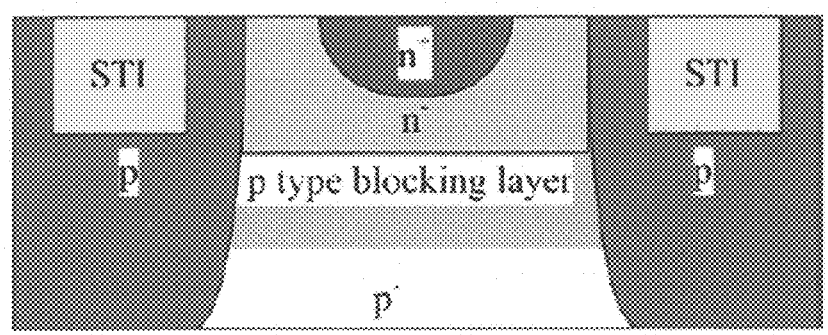
FIG. 14 is a block diagram showing an exemplary embodiment of a depleted charge switch capable of reducing charge injection in accordance with one aspect of the present application.

This approach produces several advantages: i) it may be directly coupled to sensors such as pinned photodiodes; ii) it requires extremely small charges; iii) correlated double sampling (CDS) topologies may be built using switched charge circuits to remove offsets and certain noise; iv) extremely small capacitors may be therefore be used reducing power and increasing performance (since the capacitors charge so quickly); v) there is no amplifier or component which has a finite loop bandwidth, propagation is limited by the open loop physics of devices; vi) ratios of charge movement are easy to control accurately and further only require local matching; vii) the use of transfer gates, depleted junction and floating diffusion techniques can reduce the charge injection normally associated with switched capacitor circuits when using switched charge circuits; viii) it is possible to produce pulses proportional to charge which may be easily replicated to multiple paths without significant distortion; ix) it is possible to extend the charge circuits to produce charge based decision circuits with charge pulse outputs; ix) asynchronous operation and; x) event/threshold driven neuron operation; xi) it enables the use of a simple switch matrix responsive to pulses proportional to charge (accepts pulse inputs and outputs pulse outputs), eliminating ADCs/DACs or other complex interface circuitry; xii) it overcomes inherent noise limitations of other solutions; xiii) it is compatible with schemes of arbitrary precision It was mentioned earlier that extremely small capacitors may be used. Those skilled in the art of CMOS image sensors have demonstrated 14-bit accuracy with switched floating diffusion circuits used for correlated double sampling using transfer gates, floating diffusions, charge coupled device arrays and/or pinned photodiodes using capacitances less than 10 fF or a few thousand electrons. Arbitrary precision may be implemented using oversampling techniques or by maintaining multiple MSB and LSB paths over lower precision and combining them later. This can be useful for example in learning applications. These circuits could be coupled to charge coupled shift registers to store multiple time exposed samples of an input due to the time involved with converting the many pixels to a digital value. FIG. 13 illustrates such a charge coupled device which might be used for multiple exposures or for re-ordering of weights for systolic calculation. The charge coupled device is the same as that shown in U.S. Patent application entitled "Charge Domain Mathematical Engine and Method", having Ser. No. 16/291,864, in the name of the present inventor, and which is incorporated herewith. FIG. 14 shows such a depletion junction transfer gate which reduces the charge injection associated with switching by depleting the overlap capacitances one might expect for example in a conventional switched capacitor implementation.

Figure 16:
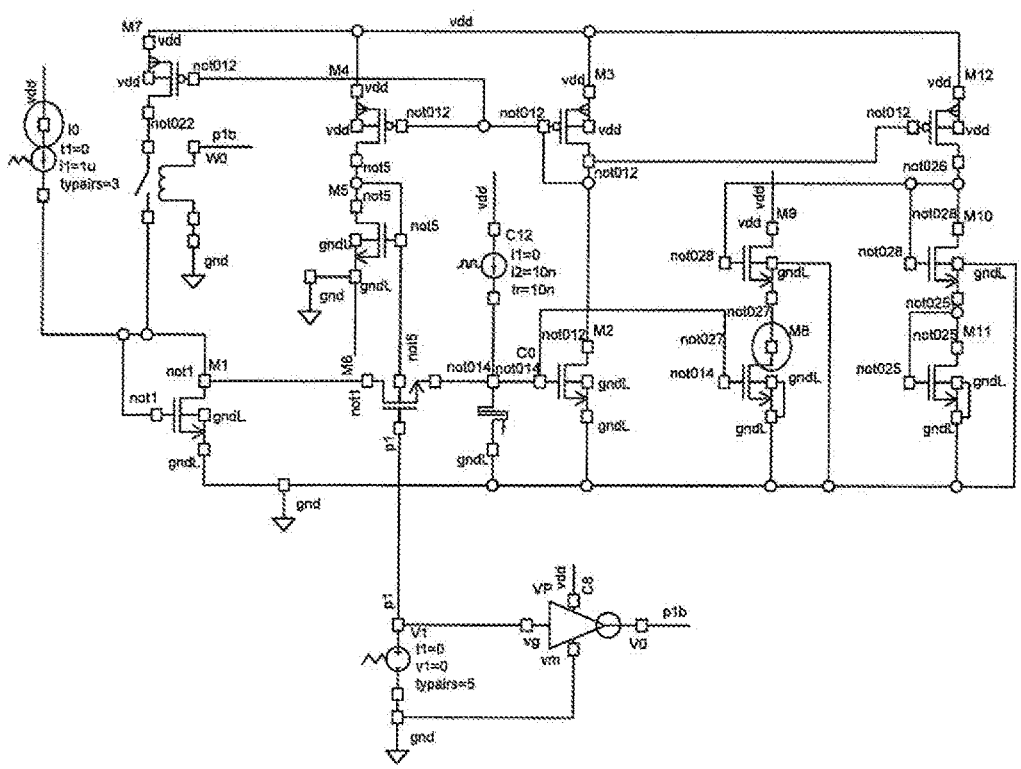
FIG. 16 is a block diagram showing an exemplary embodiment of a local short-term dynamic memory in accordance with one aspect of the present application.
Figure 17:
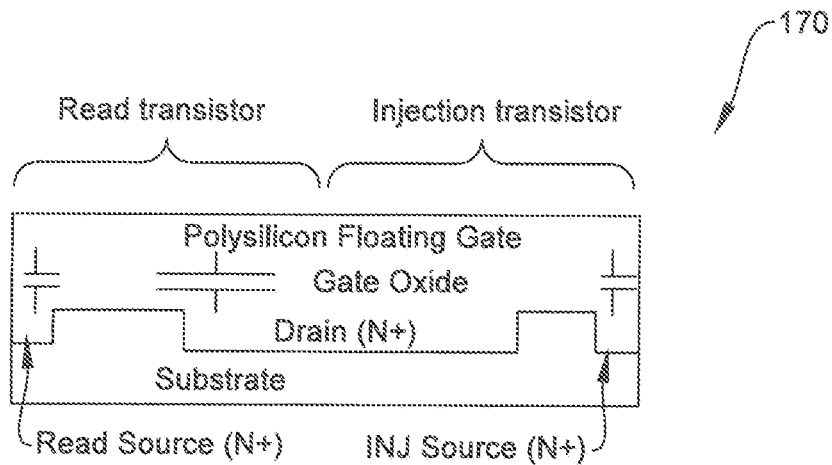
FIG. 17 is a block diagram showing an exemplary embodiment of an analog NVM charge trap current source in accordance with one aspect of the present application.

Instead of using such a shift register to store multiple input exposures upfront at the pixel, one can instead quickly store multiple copies of input data for use with multiple weighted inputs to different neurons using neuron embedded versions of the CCD shift register shown in FIG. 13 or a short-term memory such as that shown in FIG. 16. Additionally, one can use correlated double sampling (CDS) techniques with floating diffusions, transfer gates and similar cmos image sensor domain circuits to implement multipliers, decision circuits, and summers. As the charge injection in such circuits is dramatically reduced in comparison to conventional switched capacitor circuits, the equivalent magnitude of the charge storage means (e.g. capacitance or charge storage capacity of a floating diffusion) may in turn be reduced. This reduces the charge required to fill the charge reservoir (making it faster) and the amount of charge that has to be used (saving power).

The CDS reduces the offset and noise, such as flicker noise and the finite pulse-based input sampling reduces the equivalent noise bandwidth and thereby the kT/C noise, that would otherwise make such small charge reservoirs undesirable for switched charge functionality in conventional switched capacitor implementations. A novel method of implementing the above is to use a common source transistor, with a load, as the input device which in turn controls the charge movement means. This allows one to create a very small, very fast comparator means that includes CDS. To understand the CDS action consider the common source transistor TI shown in FIG. 4 is initially at its trip point. Thereafter in addition to the input charge information, noise such as flicker noise is accumulated during the loading of the input charges. When the gate voltage is charged back to the switch point of the common source transistor TI during the output pulse period it will effectively offset the previously loaded flicker noise provided efforts are made to match the equivalent noise magnitudes of the discharging and charging current sources (eg. w1 . . . wn, b vs I1). The activation output means (42 in FIG. 4) has a similar effect if it is reset to its trip point and charge is removed and then added to return to the trip point. The neuron output buffer (to the right of 44 in FIG. 4) may be an adaptive buffer to remove edge effects for a variable number of connections (dynamic load).

The use of a circuit capable of using such small capacitors allows the use of the parasitics of the devices only, or alternatively the parasitics augmented by smaller capacitors than would otherwise be required if necessary, thereby reducing die area. As the absolute value and as linearity of the capacitors does not matter in a switched charge circuit, device variations related to such parasitics may be ignored. Additionally, the use of transfer gates and depleted junction devices, as well as floating diffusions, reduces the charge injection effects which force larger capacitors upon conventional switched capacitor circuits. The use of CDS and finite noise bandwidth input sampling (pulse sample small compared to overall period) in the common source scheme removes offsets, device, temperature and other non-idealities as well as noise such as flicker and dramatically reduces kT/C noise compared to conventional switched capacitor circuits. At the same time the depleted junction transfer gates reduce charge injection.

The resulting switched charge circuits are more efficient than conventional analog approaches and further may operate at extremely high operating speeds, potentially well into the GHz or 10's of GHz ranges due to the small amount of time it takes to add or remove charge from the very small charge storage elements and the elimination of components such as opamps with finite bandwidth response profiles. In fact, the multipliers are so fast, the data rates may need to consider transmission line and other matching effects further necessitating adaptive drivers and repeaters if a pulse is to be copied to multiple paths.

All of the above allows one to implement a device and temperature independent charge-based means which requires minimum calibration and no on-going tuning as is often required with other analog means. As the pulses produced by these devices are proportional to charge and the maximum charge range at each local neuron, it is not necessary to provide any neuron to neuron calibration or tuning other than the max pulse and optionally minimum or threshold charge (potentially only once). This frees us up to develop a switch matrix that is extremely robust.

Figure 7:
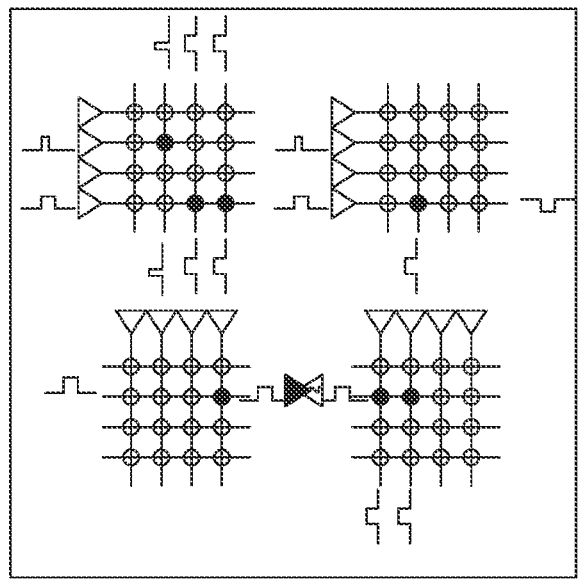
FIG. 7 is a block diagram showing an exemplary embodiment of a charge pulse crossbar in accordance with one aspect of the present application.
Figure 8:
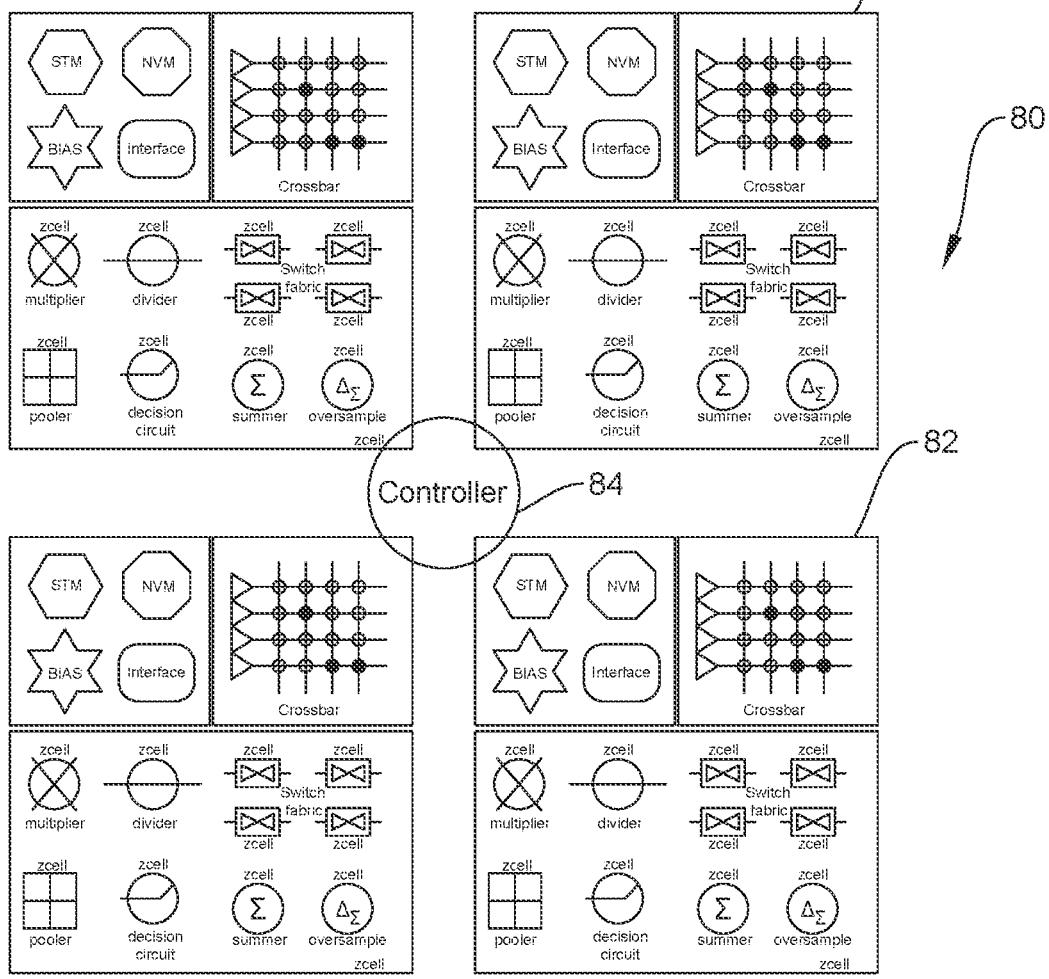
FIG. 8 is a block diagram showing an exemplary embodiment of a local group having four cores in accordance with one aspect of the present application.
Figure 9:
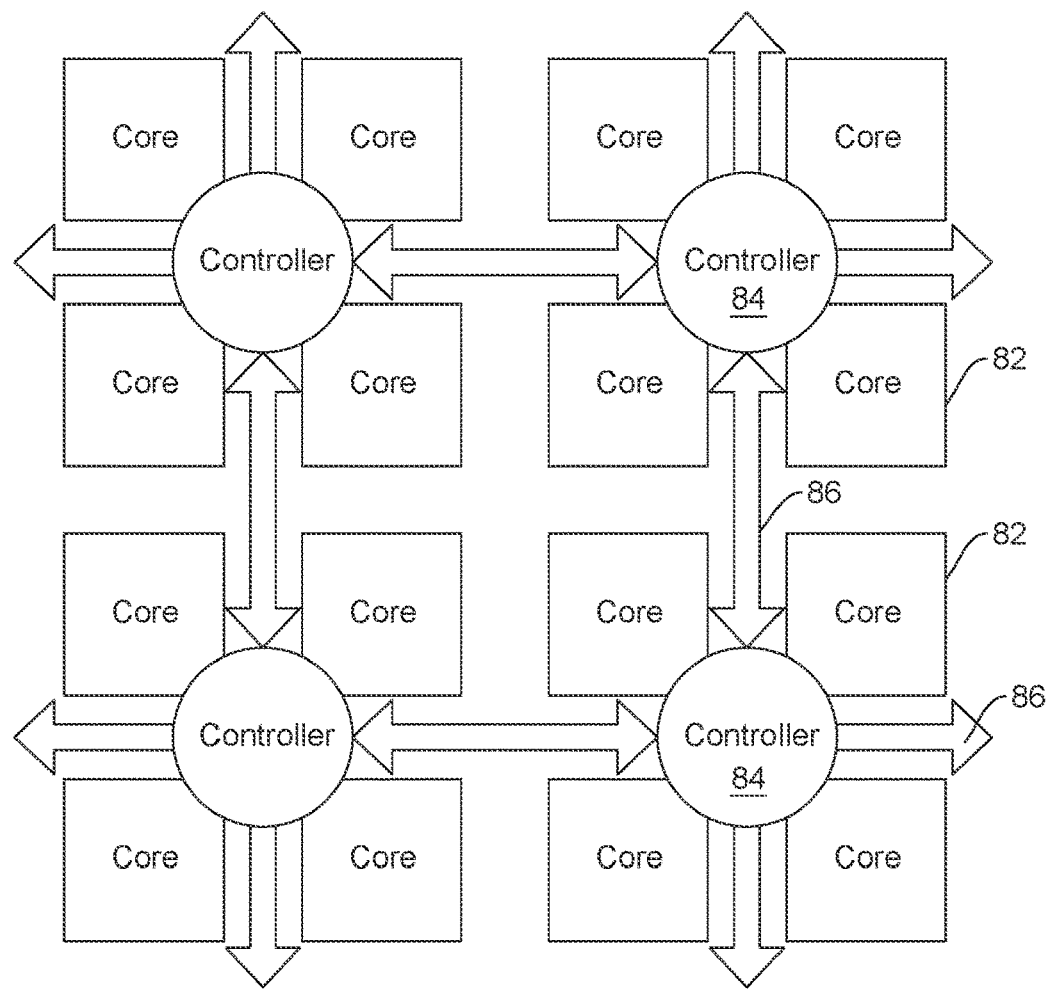
FIG. 9 is a block diagram showing an exemplary embodiment of a local group connecting to additional cores in accordance with one aspect of the present application.

The present switch matrix 80 may consist of a local core 82 which includes memory, biasing, and banks of neurons, similar to that illustrated in FIG. 8. A local controller 84 controls a crossbar, further illustrated in FIG. 7 which creates local connections between neurons in the same bank or the other four banks. This is illustrated in FIG. 9. Each local controller 84 will control a local crossbar 86 which communicates to other local controllers 84. The local controllers 84 represent the routers in a network. Groups of neurons, such as those associated with connected layers, will require a set of inputs and the local controllers 84 associated with the appropriate neurons will establish communications through crossbars (FIG. 7) and maintain a frame until all neurons associated and participating in the frame have received their input data.

The second frame information is stored in the charge reservoirs or short term memory after the initial frame and only once the last controller 84 indicates that it is finished with its first frame activities will the controllers 84 begin the second frame. The controllers 84 will also handle execution control such that neuron connections which represent virtual neurons (re-used neurons) will be connected in sequence. In this way a smaller number of neurons may simulate a much bigger neural network due to the speed that can be achieve using the switch charge (pulse networking coupled neurons) concept.

To open up switch matrix connection control during framing, the controllers 84 could associate an address with a participating neuron. This address will be digital but limited in size by being relative to the local cluster or group and be relevant only to the opening of pulse switch connections each frame. Due to the relative addressing in each neuron bank and the limited number of controllers 84 the address can be small.

Figure 15:
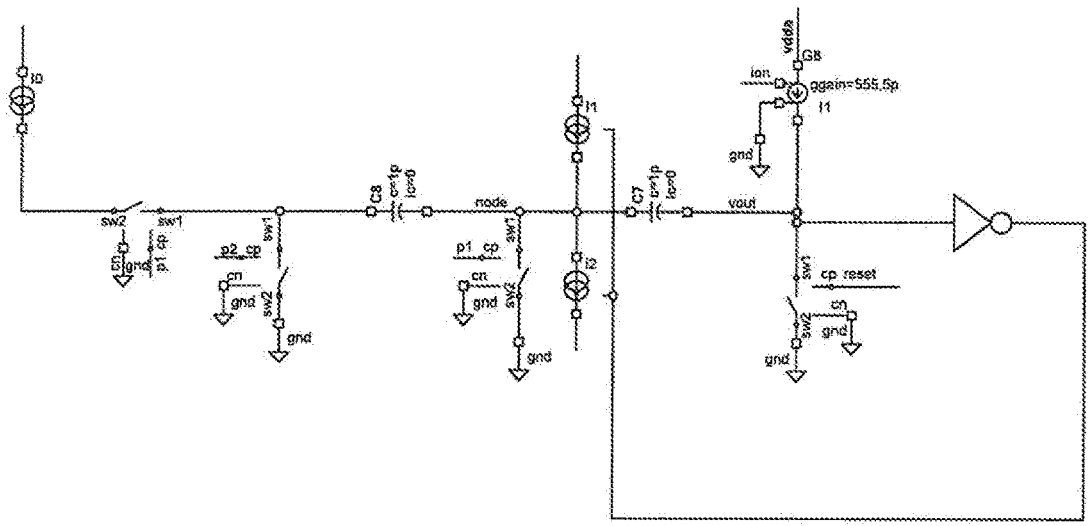
FIG. 15 is a block diagram showing an exemplary embodiment of a continuous time ΔΣ which might generate local bits which might be appended to a neuron address for local accuracy adjust in accordance with one aspect of the present application.

A user of a neural network may require improved accuracy. By appending an optional set of bits corresponding to adjustment stored locally during weight loading by a continuous time delta sigma adjustment means (oversampling) it is possible to produce improved precision. Such a continuous time delta sigma converter 90 may be shown in FIG. 15. The delta sigma converter 90 can trade time for accuracy by multiplying a test charge against a known weight to ensure the result is matched. By controlling local current sources gated against a bit stream implemented at an oversampled rate (faster than switch charge circuit switching) it is possible to produce a locally modified result of greater accuracy, and store this information digitally—for example a local controller 84 could associate the bits with a neuron address. This circuitry can also be reused to load weights from a digital calibration input and ensure they are well matched for factory loading of initial input vectors. Alternatively, we may just maintain separate LSB and MSB paths of reduced precision and combine them later for enhanced precision. Either way the taught implementation of a neural network is free of process or precision limitations similar to digital implementations and unlike many analog implementations. This also allows our analog implementation to participate in deep learning applications where additional precision is required, while most competitive analog implementations are limited to inference.

Figure 10:
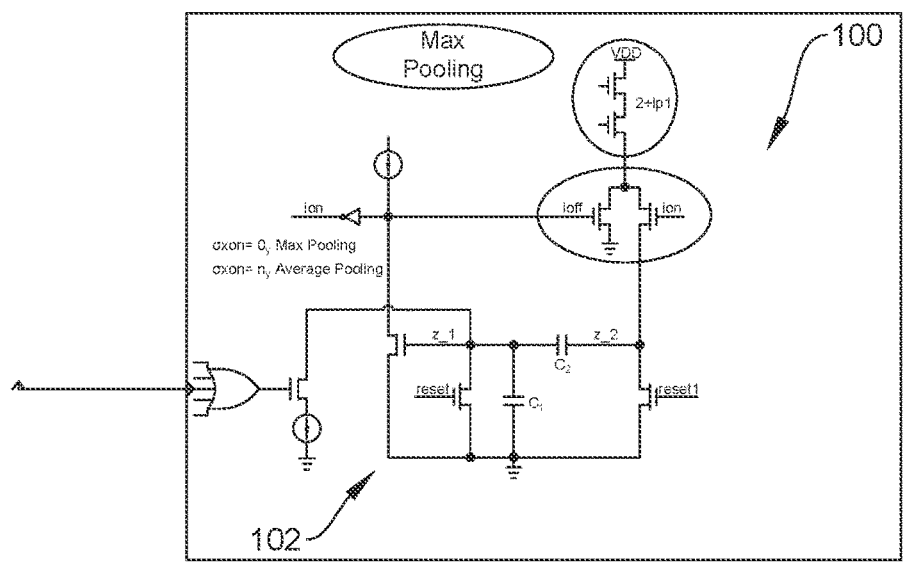
FIG. 10 is a block diagram showing an exemplary embodiment of a max pooling circuit core in accordance with one aspect of the present application.

In many neural network implementations, it is necessary to normalize a group of values, for example the result of a convolution, by taking the smallest and largest results and re-scaling the systems against these results. In a novel implementation this may be accomplished by re-calibrating the maximum charge range, threshold (e.g. half charge) range, and/or minimum charge range using these maximum, threshold and minimum values associated with these levels. This might be accomplished by using a DLL to adjust the local minimum and maximum of groups of neurons by adjusting local current sources or adjusting a fixed input bias. Max pooling may be accomplished as shown in the circuit 100 shown in FIG. 10. In the circuit 100, inputs are OR'ed together and then applied to a charge multiplier circuit 102.

Figure 5:
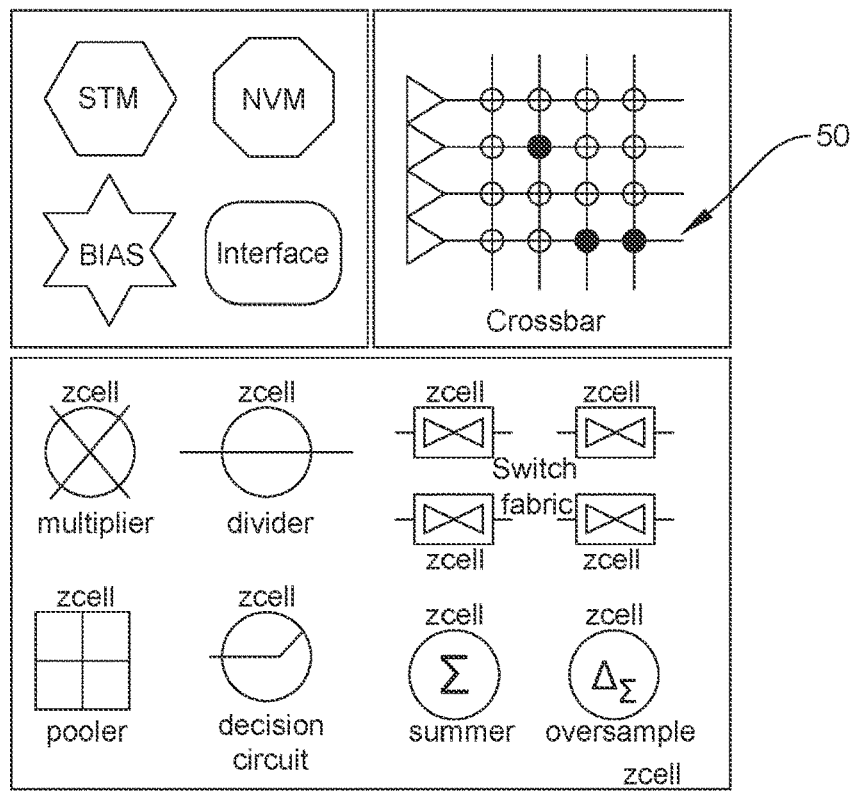
FIG. 5 is a block diagram showing an exemplary embodiment of a core in accordance with one aspect of the present application.

FIG. 5 illustrates a pulse-based cluster 50. Now that the inputs and outputs are pulses correlated to a maximum, and optionally a minimum or threshold charge level to overcome the "deadzone", one is free from physical connectivity constraints. Additionally, recurrent networks which rely upon changes of connections over time can be implemented using the time frame approach described earlier. FIG. 5 shows a group of circuits, a "cluster" that may be grouped together locally including short term memory, long term non-volatile memory, local biases, interfaces, zcell circuits (circuits that can be built from the circuitry of 3 or 4), and a cross bar. The crossbar in FIG. 5 works by connecting wires together which may then be driven with the same pulse. The triangles illustrate adaptive drives which maintain constant edge rates regardless of the number of connections that are made. The black circles represent connections while the open circles are not connected.

Figure 6:
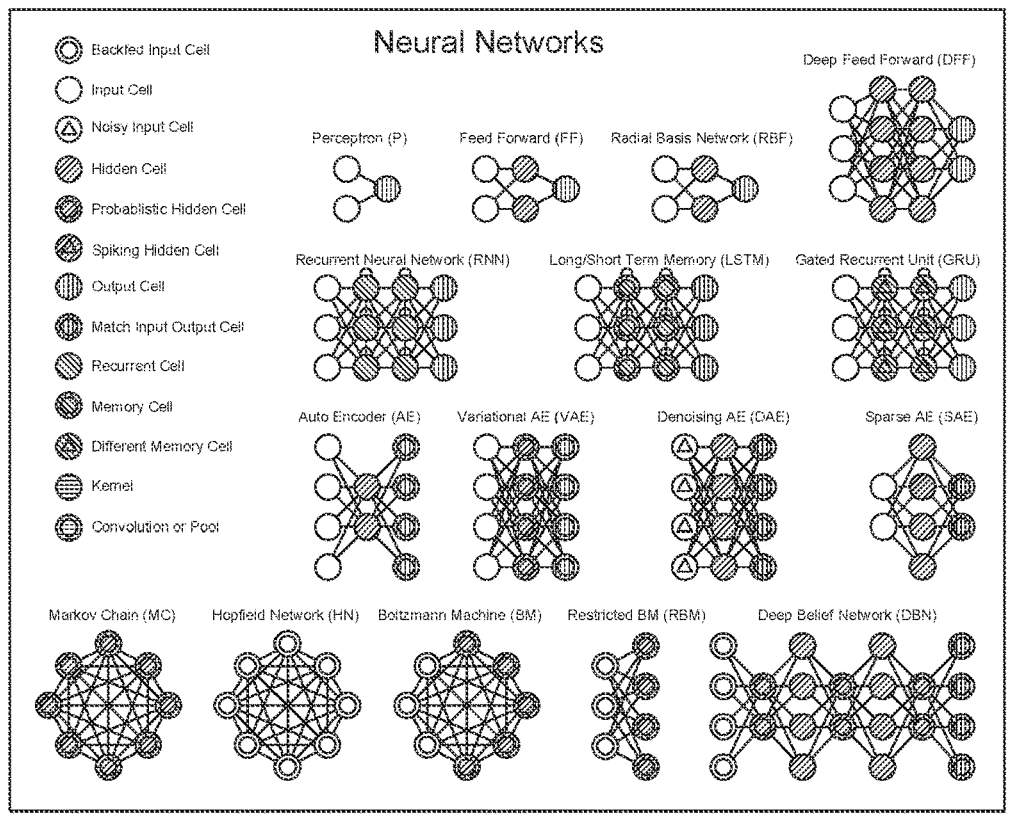
FIG. 6 is a block diagram showing an exemplary embodiment of a neural network connectivity in accordance with one aspect of the present application.

FIG. 6 illustrates the many different connectivity types that are possible in a neural network. It is desirable to be able to make these connections so as to reuse zcells to produce virtual neurons, or for recurrent neural networks in a dynamic way. FIG. 7 illustrates how a succession of crossbars might be used to connect many neurons together at the same time over distance. The common thread are simultaneous pulses driven to a number of different neurons. By utilizing time frames, different neurons could be dynamically connected at different times and pulses might travel in different directions to implement the functionality illustrated in FIG. 6.

FIG. 8 illustrates how a local controller 84 might be responsible for opening local connectivity of four cluster regions 82. We might call this configuration a core 80. FIG. 9 shows how these cores 80 might communicate with one another to open global crossbars 86 between local controllers 84 so as to open different connectivity during different frames dynamically.

Factory loading and calibration of a neural network or machine learning system can take significant time due to the large number of weights and biases that need to be loaded into a large network. By integrating the neural network in the pixel array and providing local charge domain memory one has an opportunity to parallel load the data very quickly, saving time and cost during factory calibration or during learning situations. Specifically, if a test fixture is developed which provides pixel data corresponding to the data that one wishes to load (such as weights and biases set by light intensity over a given pixel) then one can load in parallel as many weights or biases as there are pixels. For example, a 12 Mpixel array could parallel load 12M pieces of information. With a sub-1us charge accumulation time this means that it is possible to load 12M*1e6=12e12 or 12 terabytes of data per second. At an assumed accuracy of 14 bits this is equivalent to loading at a rate of 12*12=144 terabits of data per second which is difficult to match using other means.

Where MOSFETs are used to implement the current sources in a switched charge circuit, saturation or subthreshold operation could be utilized. Subthreshold region operation would reduce power at the expense of speed. The method could also be extended to other types of devices such as pHEMT, finfets, and backgate control as would be familiar to those skilled in the art.

Figure 22:
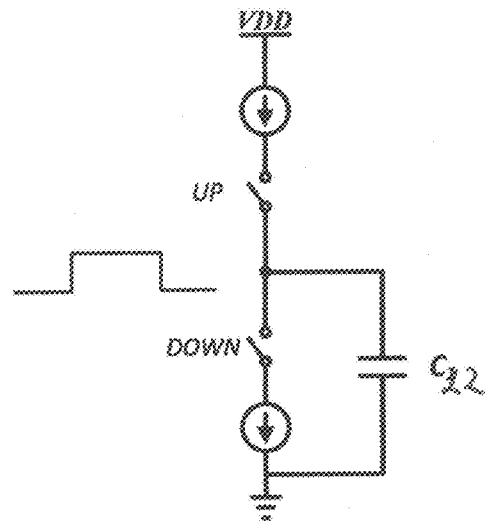
FIG. 22 is a block diagram showing an exemplary embodiment of a circuit to implement positive/negative bias to a charge stored in a capacitor in accordance with one aspect of the present application.
Figure 23:
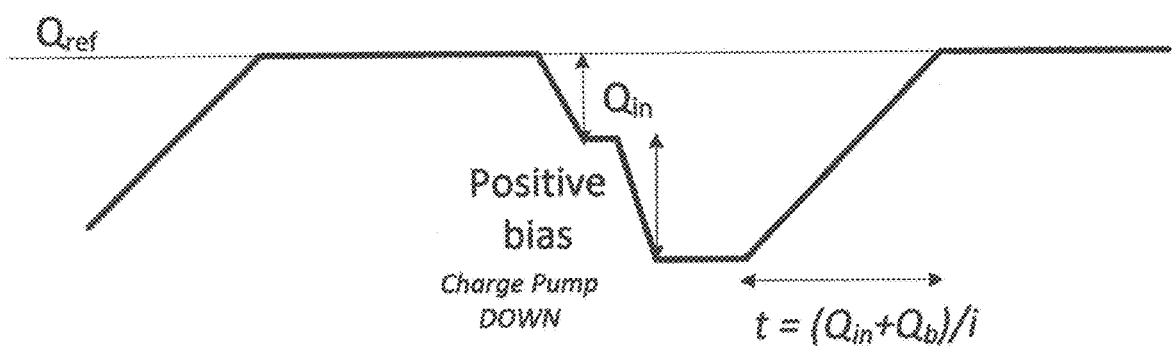
FIG. 23 is a graph showing an exemplary embodiment of how a time pulse sum is generated from multiple input charges in accordance with one aspect of the present application.

A method and apparatus to add positive or negative charge to a control register such as a memory element or capacitor is shown in FIG. 22 which is symbolized by 112 in FIG. 16. In this case the voltage on the capacitor $C_{22}$ may be increased or decreased using short pulses, for example to adjust weight values in learning applications. For example, i*tpulse is the incremental charge if a positive pulse is applied and −i*tpulse is the decremental pulse with a negative charge pulse. The magnitude of the applied bias steps can be adjusted by changing the pulse width or the current bias level. This is shown in FIG. 22. FIG. 23 illustrates the pulse based loading of charges and output pulse concept of a switched charge MAC (multiply and accumulate circuit) or zcell, showing the change of charge level from a reference level as input charges are loaded and illustrates a pulse output time proportional to charge as the system is returned to the reference level.

Figure 24:
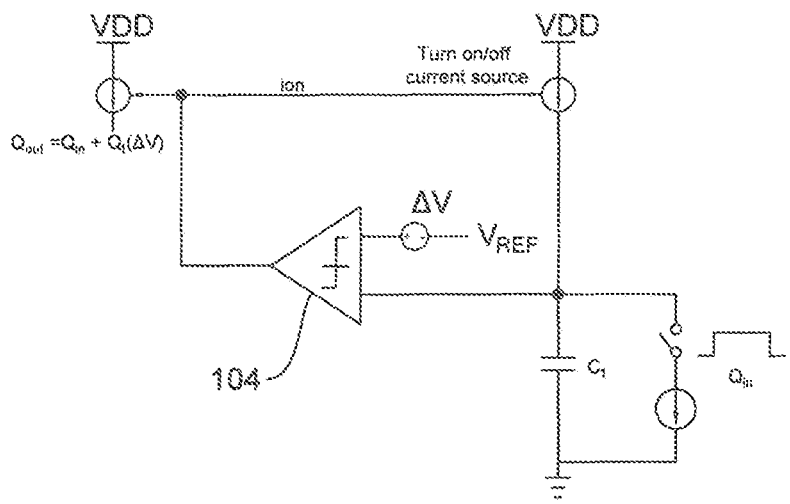
FIG. 24 is a block diagram showing an exemplary embodiment of a circuit for adding a bias by shifting a $V_{REF}$ level in accordance with one aspect of the present application.

This may be used to alter weights during the learning process for example or to implement a bias on a neuron. FIG. 24 shows a method by which to implement a neuron bias by shifting the level of the reference voltage applied to the comparator 104 after the calibration cycle. It should be noted that in the above explanations $V_{REF}$ and $\Delta V$ may be substituted for $Q_{REF}$ and $\Delta Q$.

Figure 25:
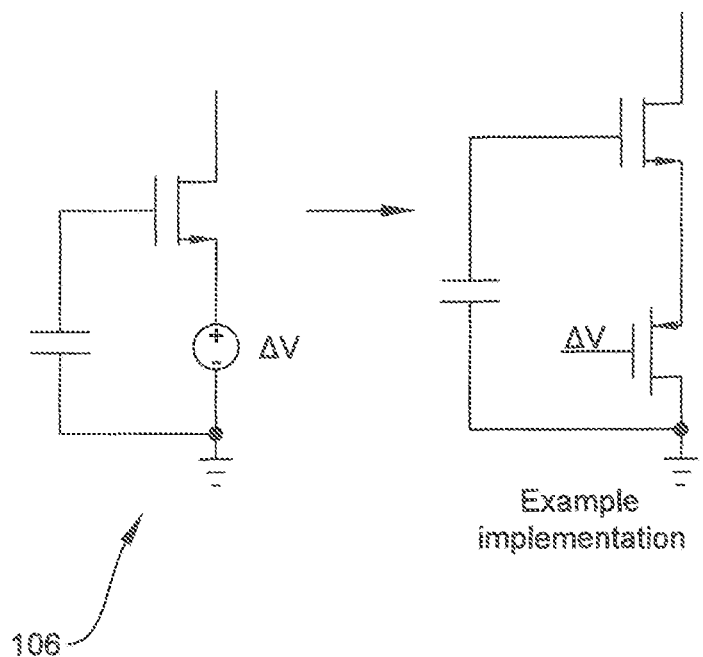
FIG. 25 is a block diagram showing an exemplary embodiment of a common source stage in accordance with one aspect of the present application.
Figure 26:
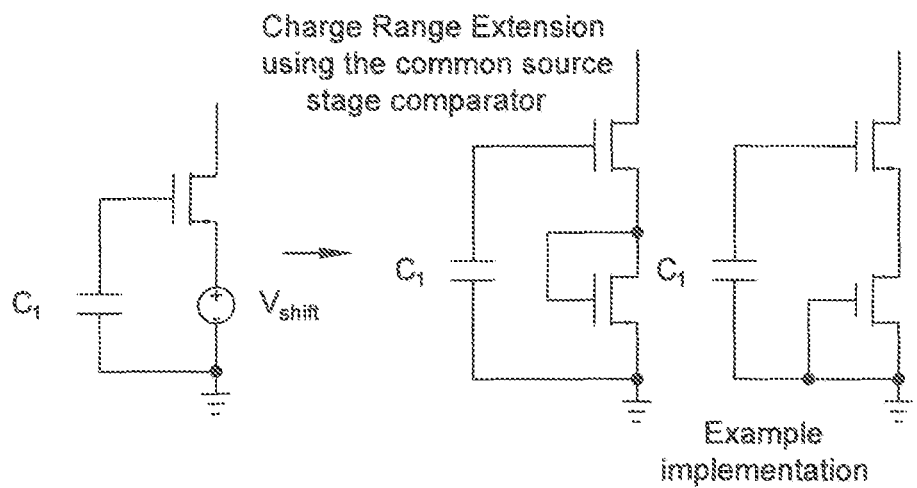
FIG. 26 is a block diagram showing an exemplary embodiment of charge range extension by level shifting in accordance with one aspect of the present application.

The use of a common source comparator whose gate node is used to load a charge produces a dynamic range limited by the gate voltage or requires isolation to allow the gate to be taken to negative voltages. To extend the range the method shown in FIG. 25 or FIG. 26 may be used. By shifting the common source trip point higher, it is possible to increase the dynamic range of the gate node when loading charge. It should be noted that to improve the switch performance of the common source comparator it is desirable to increase its size to increase gm. Unfortunately doing so reduces the trip voltage, further inhibiting our voltage range. Therefore, the use of a level shift, such as a diode connected device or follower as shown in FIG. 26, between the source of the common source comparator and ground allows both increased gm and dynamic charge range. The use of a positive feedback such as Schmitt like switching techniques can also be used in conjunction with these techniques to optimize switch point and minimize any "deadzones" related to finite comparator switching time and overshoot.

Figure 27:
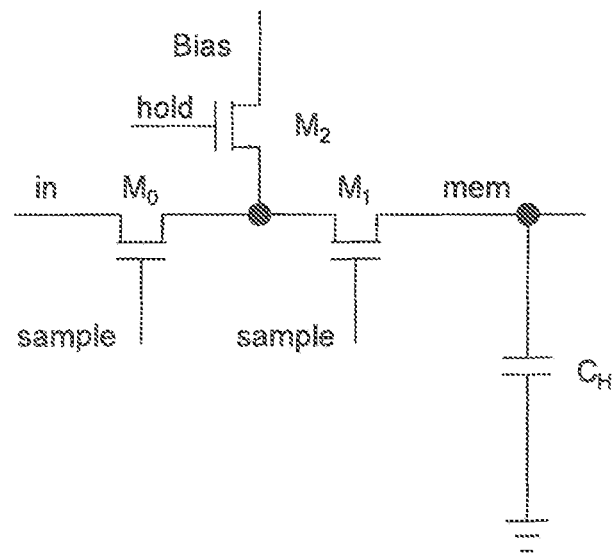
FIG. 27 is a block diagram showing an exemplary embodiment of a short term memory scheme improving sample and hold time be reducing switch leakage.

With respect to short term memory, which might be used for example to temporarily store weights or input information, the method shown in FIG. 27 might be used. In this case pulling the M1 control gate to ground or below ground and raising the shared node between M0 and M1 minimizes the channel leakage if the voltage on this shared node is close to Vmem. Even if the match is not exact, by reducing the voltage across the channel the channel leakage is reduced. FIG. 16 also shows methods of also moving the backgate of the switching element M5 to minimize channel leakage.

Figure 28:
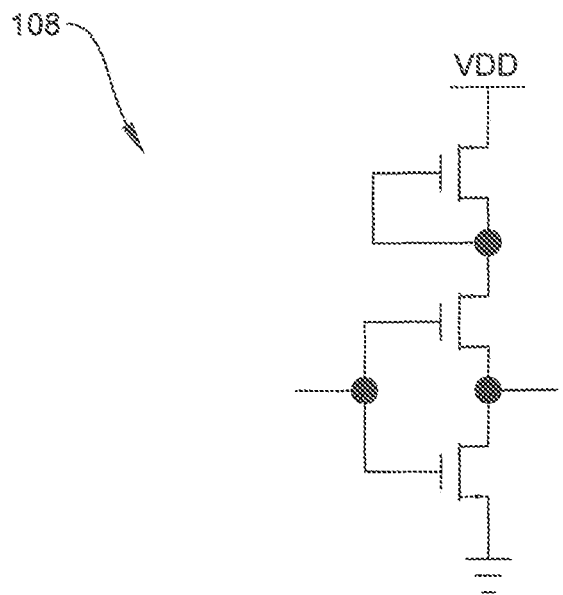
FIG. 28 is a block diagram showing an exemplary embodiment of a circuit to limit a gate voltage of a MOS switch in accordance with one aspect of the present application.

In FIG. 28 a method to reduce the charge injection and capacitive feedthrough during turn off of the sampling switch is shown as 108. The idea is to limit the gate voltage range. Other bootstrap techniques may also be used that attempt to minimize the voltage switch range or provide a path for escaping charge. Additionally, the inversion and overlap capacitance charges of the MOS switch and the capacitive feedthrough are both proportional to the gate voltage. A longer gate means less leakage but more inversion and overlap charge, which why having a digital driver with reduced output voltage level will reduce the injection, at the cost of limiting the maximum voltage that can be used. This scheme might also be implemented as a floating driver which is adaptive to the stored voltage.

Figure 21:
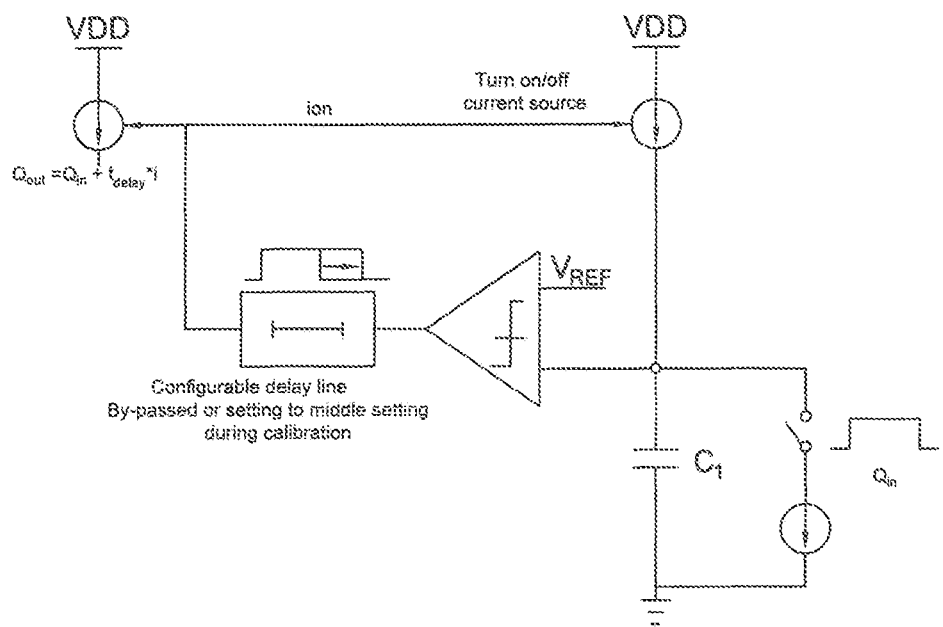
FIG. 21 is a block diagram showing an exemplary embodiment of a circuit to add bias to a charge input in accordance with one aspect of the present application.

The implementation of a bias to a neuron is a standard method in neural networks. FIG. 21 illustrates a method where a programmable delay line might be used to generate a bias. This bias might be created responsive to a value stored in short term or long-term memory.

It should be noted that the input signal layer is very flexible when using switched charge devices. For imaging applications, a pinned floating diode might be used as the input storage means to which the charge transfer means is coupled in a switched charge circuit (e.g. FIG. 2, 3 or 4). A global shutter and charge multiplier means might then be used to multiply the input charge or to normalize the system. Alternatively the system may accept charges in other ways by converting them first to charge proportional pulses which are then coupled to the a switch charge circuit, such as the gate of a common source comparator shown in FIG. 3 or 4. Examples might be charge, voltage, or current inputs from a MEMs or other type of microphone, or the capacitance formed by MEMs membranes in a MEMs microphone may be placed in parallel with the common source comparator gate, or inputs could be from an image sensor, ultrasound, APD photodetector, radar, accelerometer, gyro, pressure gauge or other sensor inputs.

Figure 29:
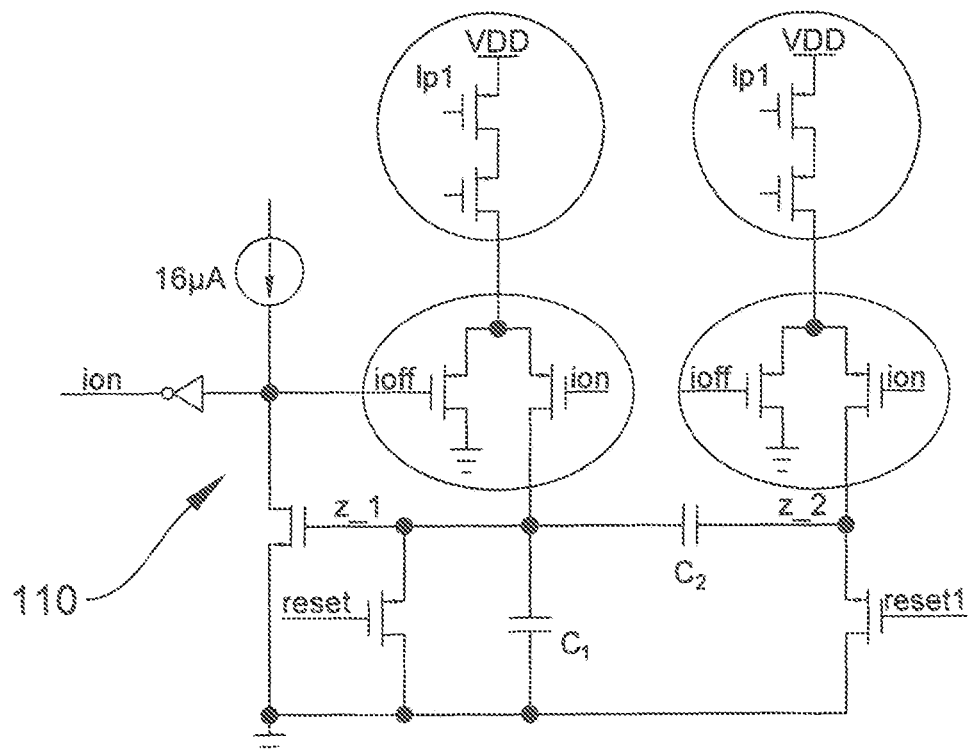
FIG. 29 is a block diagram showing an exemplary embodiment of a steering circuit for fast startup in accordance with one aspect of the present application.

FIG. 29 illustrates steering circuits 110 used to allow fast operation of the single transistor charge multiplier or zcell. Due to the finite settling time of current sources, the use of a steering circuit 110 with an already established current source allows rapid re-direction of current or charge movement means using a comparator such as that used in the single transistor charge multiplier. The current source may still be turned off between operations to save static power, however, during actuation such as moving from the first to second phases of a zcell operation such as described for FIG. 2, 3 or 4, errors related to switching which could otherwise degrade the charge ratios are reduced if the steering circuit 110 is used. This can be extended to other charge movement means which might by dynamic—i.e. charge sources could be charged just before use with a minimum charge so as to automatically limit power loss rather than actuating and disabling sources. Also, the steering circuits could for example alternatively switch in the next weight which was "on deck" and ready for fast application for neuron or MAC reuse instead of having to load it sequentially and waiting for it to stabilize. The steering circuit could be at the end of a local buffer pipelining weights to the "on deck" position to optimize "process in memory" power consumption.

It will be noted by those skilled in the art that communicating charge information as pulses eliminates the need for matching capacitors in switched charge circuits. It also eliminates the need for tuning between stages. Only local tuning is required to optimize the charge range for a given multiplier or decision circuit.

Various implementations of the above means and methods will be known to those skilled in the art, especially where different switches, charge storage means, or charge movement means are inserted in place of those described and different timing means or variations of charge pulse communications are implemented.

While embodiments of the disclosure have been described in terms of various specific embodiments, those skilled in the art will recognize that the embodiments of the disclosure may be practiced with modifications within the spirit and scope of the claims

What is claimed is:

1. A switched charge circuit comprising:
at least one input charge storage device coupled to an input to receive a charge during an initial phase, wherein the at least one input charge storage device is initially reset to one of a potential or charge threshold;
at least one output charge storage device coupled to an output and to the at least one input charge storage device, wherein the at least one output charge storage device is initially reset to a charge level;
a comparison device coupled to a shared node connecting the at least one input charge storage device and the at least one output charge storage device;
at least one first current source coupled to the at least one output charge storage device
at least one second current source coupled to the shared node connecting the at least one input charge storage device and the at least one output charge storage device proportional in magnitude to the at least one first current source to produce a one of a charge multiplication or division on the at least one output charge storage device;
wherein the at least one first current source and the at least one second current source are turned on at the beginning of a second phase and turned off when the shared node reaches one of a potential or charge threshold producing an output pulse proportional to a magnitude of the one of charge multiplication or division.

2. A switched charge circuit comprising:
at least one input switched charge reservoir initially reset to a charge threshold and coupled to an input to receive charge during an initial phase;
at least one output switched charge reservoir initially reset to the charge threshold, coupled to an output and to the first input charge reservoir in functional series;
a comparison device coupled to a shared node connecting the at least one input switched charge reservoir and the at least one output switched charge reservoir;
at least one first charge movement device coupled to the at least one output switched charge reservoir;
at least one second charge movement device coupled to the shared node proportional in magnitude to the at least one first charge movement device to charge the at least one input switched charge reservoir and the at least one output switched charge reservoir at proportional charge rates to produce one of a charge multiplication or division;
wherein the at least one first charge movement devices and the at least one second charge movement device are turned on at the beginning of a second phase and turned off when the shared node reaches one of a reference potential or charge threshold; and
a driver producing an output pulse proportional to a magnitude of the one of the charge multiplication or division by driving the output pulse during a time that the at least one first charge movement devices and the at least one second charge movement device are on during a second phase.

3. A switched charge circuit comprising:
a first charge storage device initially reset to one of a first potential or first charge threshold and coupled to an input to receive an input charge during an initial phase;
wherein said first charge storage device receives charge from said input constituting at least a first charge movement device of programmable magnitude gated by a charge pulse where said pulse width constitutes a charge proportional input value and the first charge movement device magnitude constitutes a weight;

wherein gating of the first charge movement device by the charge proportional input values produces multiplied weight by value charge inputs which are summed on the first charge storage device;

wherein after the weighted value charge inputs have been coupled to the first charge storage device an output charge movement device proportional to said at least first charge movement device is enabled during a second phase to return the first charge storage device to the one of first potential or first charge threshold, and then turned off;

wherein a driver produces a pulse during a time that the at least first one-charge movement device is active so as to produce a pulse output whose period represents a weighted sum of the input values.

4. The switched charge circuit of claim 1 or 2, wherein the comparison device is a common source MOSFET.

5. The switched charge circuit of claim 4, wherein positive feedback is used to reduce the overdrive required for switching to occur and thereby decrease the "deadzone" of operation.

6. The switched charge circuit of claim 1 or 2, wherein the comparison device is a common source MOSFET with a source level shifted relative to ground.

7. The switched charge circuit of claim 6, comprising a diode connected mosfet connected between a source of the common source MOSFET and ground.

8. The switched charge circuit of claim 6, wherein the source of said common source MOSFET is lifted by a follower to control a switch point voltage.

9. The switched charge circuit of claim 1, wherein a driver creates replica charge pulses where the replicated charge pulses are driven adaptively such that magnitudes and edges are the same as the pulse being replicated regardless of load.

10. The switched charge circuit of claim 1, 2, or 3, wherein the switched charge circuit is operated in a subthreshold region to reduce power.

11. The circuit of claim 1, 2, or 3, wherein the input is normalized by adjusting the magnitude of a second charge movement device.

12. The switched charge circuit of claim 1, wherein a sum of the at least one first current source and at least one second current source is at a constant magnitude while varying a ratio between the at least one first current source and at least one second current source to maintain a fixed overshoot for a comparator.

13. The switched charge circuit of claim 3, wherein the said output charge movement device is disabled by a control signal until all charge inputs have arrived.

14. The switched charge circuit of claim 3, comprising:

a second charge storage device initially reset to one of a second potential or second charge threshold, wherein a charge corresponding to a decision circuit threshold is further loaded onto the second charge storage device;

a second charge movement device simultaneously enabled with the first charge movement device terminating when the second charge storage device reaches said second potential or second charge threshold where an output is produced by OR'ing simultaneous outputs of pulses which are on while each of said charge movement devices are on;

wherein an output of the OR'ing is a ReLU output in pulse proportional to charge form.

* * * * *